(12) United States Patent  
Swoboda

(10) Patent No.: US 7,962,814 B2
(45) Date of Patent: Jun. 14, 2011

(54) MODE SELECTION BASED ON SPECIAL SEQUENCE OF STATE MACHINE STATES

(75) Inventor: Gary L. Swoboda, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 7 days.

(21) Appl. No.: 12/496,267

(22) Filed: Jul. 1, 2009

(65) Prior Publication Data

US 2009/0265595 A1 Oct. 22, 2009

Related U.S. Application Data

(62) Division of application No. 11/292,597, filed on Dec. 2, 2005, now Pat. No. 7,571,366.

(60) Provisional application No. 60/632,640, filed on Dec. 2, 2004.

(51) Int. Cl.
*G06F 11/00* (2006.01)
*G01R 31/28* (2006.01)

(52) U.S. Cl. .......................................... 714/727; 714/30
(58) Field of Classification Search .................. 714/727, 714/726, 724, 729, 741, 25, 30, 32, 33, 37; 716/1, 4
See application file for complete search history.

(56) References Cited

U.S. PATENT DOCUMENTS

| 5,333,139 | A | * | 7/1994 | Sturges | 714/727 |
| 5,636,227 | A | * | 6/1997 | Segars | 714/729 |
| 6,163,864 | A | * | 12/2000 | Bhavsar et al. | 714/727 |

* cited by examiner

*Primary Examiner* — Christine T Tu
(74) *Attorney, Agent, or Firm* — Lawrence J. Bassuk; W. James Brady; Frederick J. Telecky, Jr.

(57) ABSTRACT

A method of causing an interface to implement a mode from a plurality of selectable modes in which the interface operates according to a plurality of states defined by a state machine comprises sequencing through a sequence of the states, and detecting a predetermined sequence of the states. The predetermined sequence of the states represents a no-operation for at least one of the modes and also represents a mode change command.

3 Claims, 24 Drawing Sheets

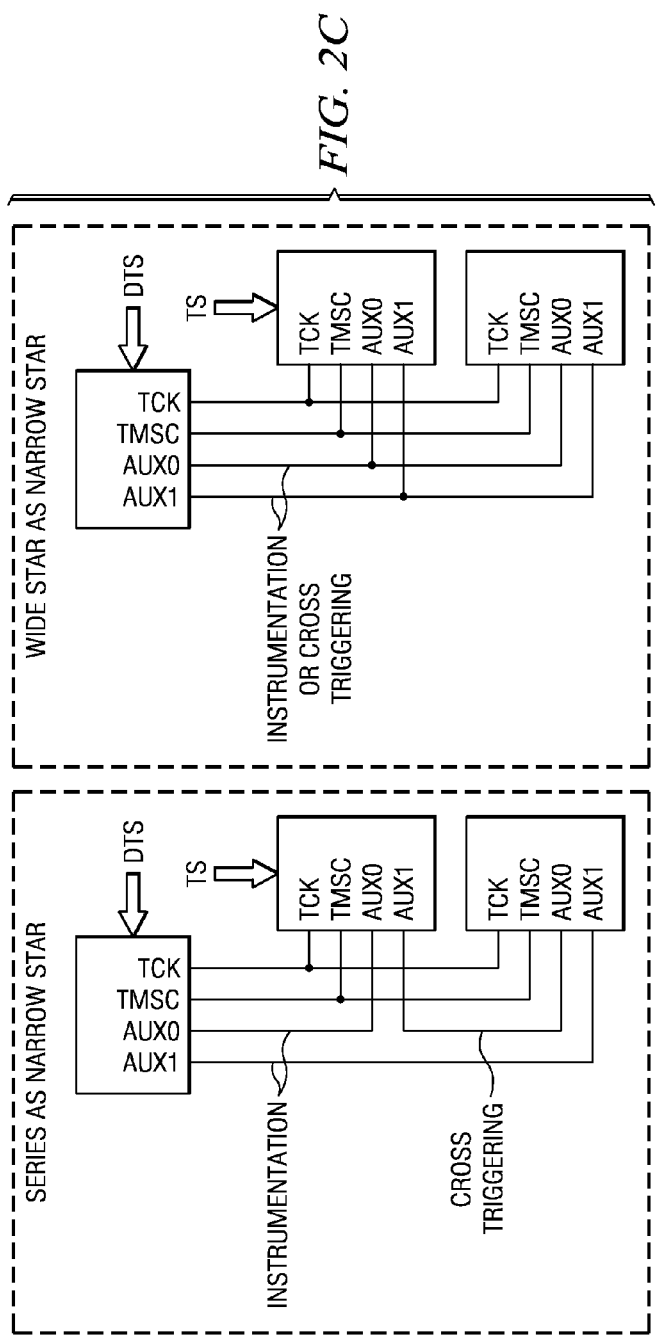
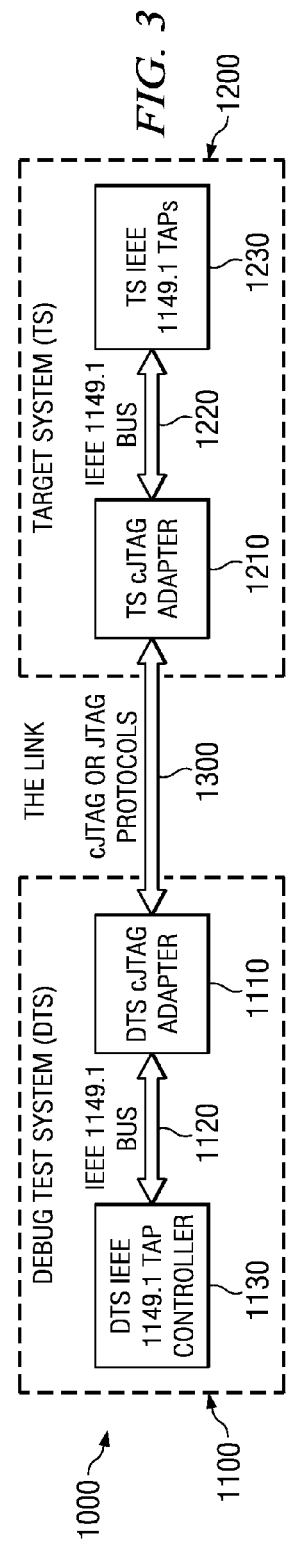

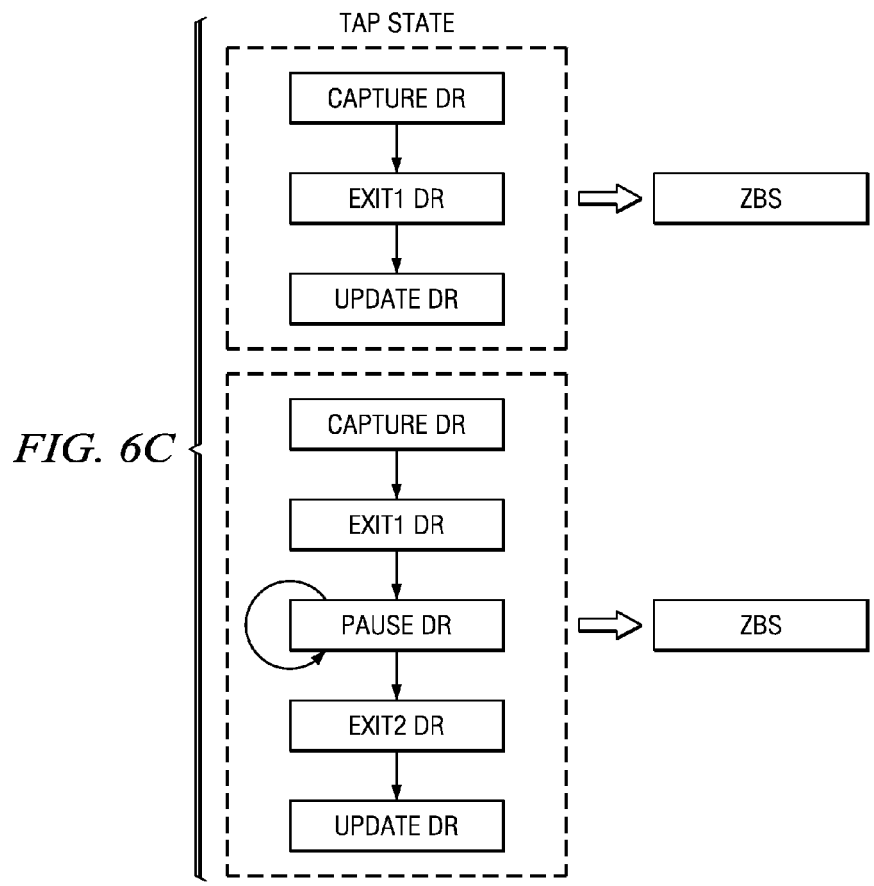

FIG. 6C

| LEVEL | TYPE | DESCRIPTION |
|---|---|---|
| 0 | PUBLIC | COMMAND WINDOW IS CLOSED, DR SCANS OPERATE NORMALLY |
| 1 | PUBLIC | CDX TRANSFERS USE THE Shift_DR STATE IF CDX IS ENABLED, ELSE DR SCANS OPERATE NORMALLY |
| 2 | PUBLIC | cJTAG CONTROL REGISTERS MAY BE CHANGED BY COMMAND SEQUENCES. DATA TRANSFERS TO THE DTS FUNCTION NORMALLY IN STANDARD AND ADVANCED MODES. |
| 3 | PUBLIC | cJTAG CONTROL REGISTERS MAY BE CHANGED BY COMMAND SEQUENCES. TDO REMAINS IN A HI-z STATE IN STANDARD MODE. READ DATA IS ALWAYS A ONE IN ADVANCED MODE |
| 4-5 | PUBLIC | RESERVED |
| 6 AND ABOVE | PRIVATE | USER DEFINED |

FIG. 8A

| SCAN COUNT | MNEMONIC | DESCRIPTION |
| --- | --- | --- |
| 0 | SCA | STORE CONTROL ACTION |
| 1 | MSS | MAKE SCAN SELECTION |
| 2 | MTS | MAKE TRANSPORT SELECTION |
| 3 | SLID | STORE LINK ID |
| 4 | ILID | INVALIDATE LINK ID |
| 5 | STF | STORE TRANSPORT FORMAT |
| 6 | SSF | STORE SCAN FORMAT |
| 7 | SRS | STATUS READ/SERIAL SELECT |
| 8 | XPE | TRANSPORT ENABLE |
| 9 | rsv0 | RESERVED FOR cJTAG EXTENSIONS |
| 10 | LECP | LOAD EXTENDED COMMAND PAGE |
| 11 | RECP | READ EXTENDED COMMAND PAGE |
| 12 | EXC0 | EXTENDED COMMAND 0 (USER DEFINED) |
| 13 | EXC1 | EXTENDED COMMAND 1 (USER DEFINED) |
| 14 | EXC2 | EXTENDED COMMAND 2 (USER DEFINED) |
| 15 | EXC3 | EXTENDED COMMAND 3 (USER DEFINED) |
| 16-31 | LTR | LOAD TEMP REGISTER |

*FIG. 8B*

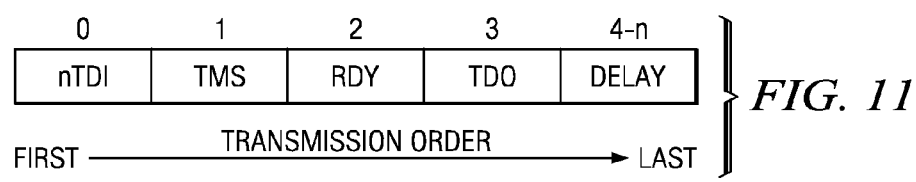

*FIG. 11*

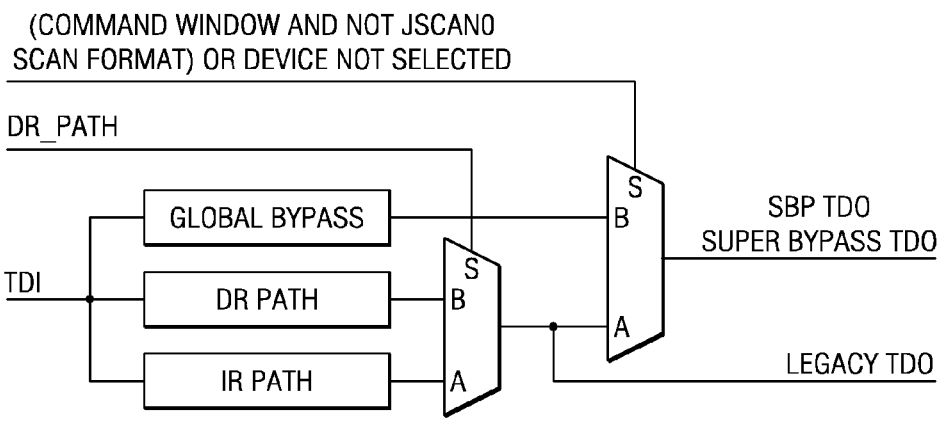

*FIG. 18*

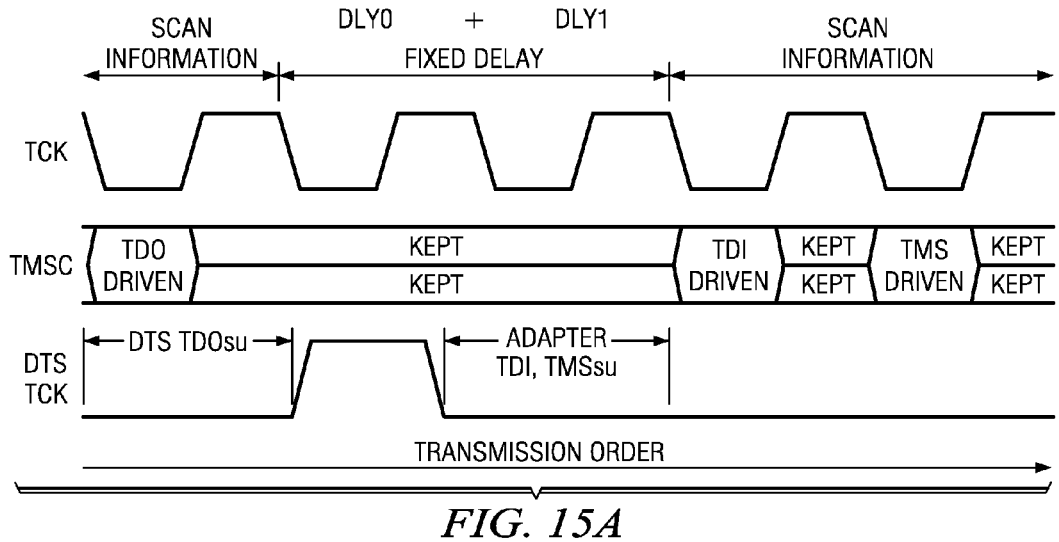
FIG. 15A
FIG. 15B
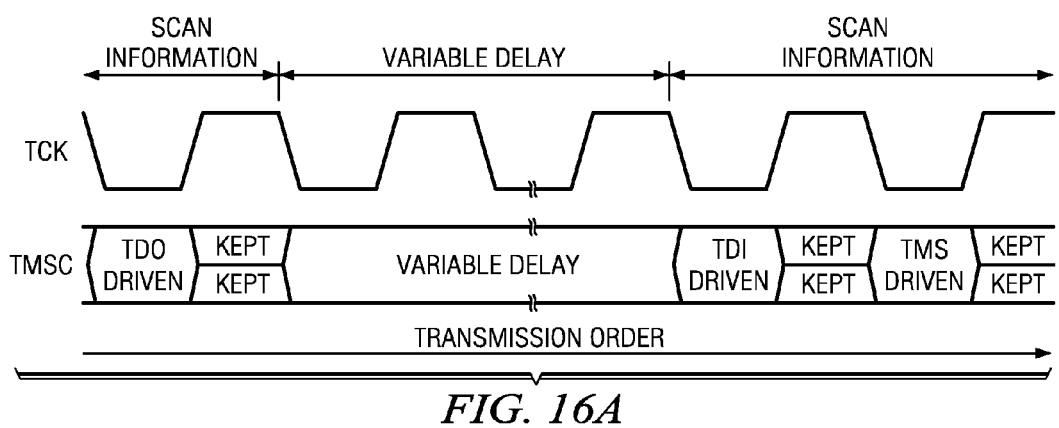
FIG. 16A

MODE SELECTION BASED ON SPECIAL SEQUENCE OF STATE MACHINE STATES

CROSS-REFERENCE TO RELATED APPLICATIONS

This application is a divisional of prior application Ser. No. 11/292,597, filed Dec. 2, 2005, now U.S. Pat. No. 7,571,366, issued Aug. 4, 2009; which incorporates by reference and claims priority to provisional patent application "Minimal Test Access Port Interface to the IEEE 1149.1 Standard Test Access Port", Ser. No. 60/632,640, filed Dec. 2, 2004.

BACKGROUND

As electronic circuits and devices have become more complex, testing of these devices has become increasingly difficult. Test standards have been developed to address at least some of these testing difficulties. One such standard, written by the Joint Test Action Group ("JTAG"), is IEEE standard number 1149.1, which describes the Standard Test Access Port and Boundary-Scan Architecture. Boundary scan is a methodology that allows controllability and observability of the boundary pins in a JTAG compatible device via software control. This capability allows testing of circuit boards that otherwise might not be practical or possible given the trace pitch and multi-layering of printed circuit boards today. Testing is accomplished through a series of registers, accessible through a serial bus, which allow the pins of JTAG compatible devices to be temporarily isolated from their respective devices. The pin on one isolated JTAG compatible device may be set to a known test state while the pin on another isolated JTAG compatible device is monitored to confirm that it is in the same known state. In this way individual traces on a printed circuit board may be tested. This type of testing has generally represented the limits of the testing capabilities of the JTAG architecture.

SUMMARY

The present disclosure describes a system and method for testing a target system.

BRIEF DESCRIPTION OF THE DRAWINGS

For a detailed description of the preferred embodiments of the invention, reference will now be made to the accompanying drawings in which:

FIG. 2C illustrates a series and a wide star cJTAG capable system configured, both configured to operate as narrow star configurations in accordance with at least some preferred embodiments;

FIG. 3 illustrates a block diagram overview of a cJTAG capable system in accordance with at least some preferred embodiments;

FIG. 6C illustrates a simplified version of FIGS. 6A and 6B in accordance with at least some preferred embodiments;

FIG. 8A illustrates an example of an assignment of various functions to specific command levels in accordance with at least some preferred embodiments;

FIG. 8B illustrates an example of specific scan counts associated with specific advanced mode commands in accordance with at least some preferred embodiments;

FIG. 11 illustrates the format for an optimized scan message in accordance with at least some preferred embodiments;

FIG. 15A illustrates the timing diagram of a fixed delay between scan messages in accordance with at least some preferred embodiments;

FIG. 15B illustrates an example of delay control register bit settings in accordance with at least some preferred embodiments;

FIG. 16A illustrates the timing diagram for a variable delay between scan messages in accordance with at least some preferred embodiments;

FIG. 18 illustrates a cJTAG target system implementing a global bypass bit in accordance with at least some preferred embodiments;

NOTATION AND NOMENCLATURE

Certain terms are used throughout the following discussion and claims to refer to particular system components. This document does not intend to distinguish between components that differ in name but not function.

In the following discussion and in the claims, the terms "including" and "comprising" are used in an open-ended fashion, and thus should be interpreted to mean "including but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more parts and may be used to refer to a computer system or a portion of a computer system. Further, the term "software" includes any executable code capable of running on a processor, regardless of the media used to store the software. Thus, code stored in non-volatile memory, and sometimes referred to as "embedded firmware," is included within the definition of software.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. The discussion of any embodiment is meant only to be illustrative of that embodiment, and not intended to intimate that the scope of the disclosure, including the claims, is limited to that embodiment. "Compact JTAG (cJTAG)", revision 0.9, dated Nov. 20, 2005 is incorporated herein by reference.

Similarly, "Compact JTAG (cJTAG)", revision 0.9, which provides a detailed specification for the compact JTAG ("cJTAG") architecture, is also meant to describe an illustrative embodiment and is not intended to limit the present disclosure to the cJTAG architecture described.

The IEEE 1149.1 standard (also known as the JTAG architecture) was originally developed for board-level interconnect testing (sometimes referred to as "boundary testing"). Standard JTAG implementations do not permit debug and testing of the individual JTAG compatible components that are mounted on a printed circuit board. Such component test and debug can be accomplished, however, through extensions and variations of the JTAG architecture, in accordance with at least some preferred embodiments, while still keeping the debug and test system ("DTS") that controls the test sequence, as well as the target system ("TS") comprising the components that are being tested, compatible with the underlying JTAG architecture and communication protocol.

Figure 1:
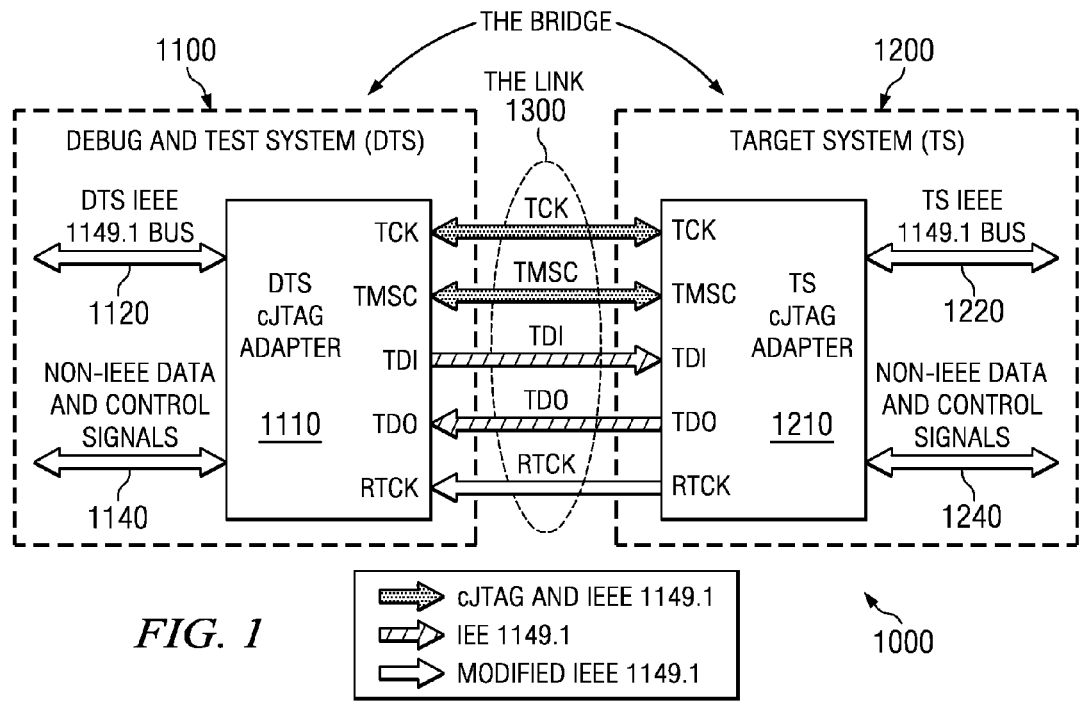
FIG. 1 illustrates the signals of a link between a debug test system and a target system of a cJTAG capable system in accordance with at least some preferred embodiments.

FIG. 1 illustrates a system 1000 constructed in accordance with at least some preferred embodiments, comprising a debug test system ("DTS") 1100 and a target system ("TS") 1200, coupled to each other by link 1300. The debug test system 1100 may comprise a DTS cJTAG adapter 1110, a DTS IEEE 1149.1 bus ("DTS bus") 1120, and non-IEEE data and control signals 1140. The term "cJTAG" refers to "compact JTAG," which is an extension of the JTAG standard that uses fewer communications signals, as will be described below. The DTS cJTAG adapter 1110 provides the logic necessary to convert the standard JTAG signals present on DTS bus 1120 into the signals and message formats defined for cJTAG operation. The DTS bus 1120 couples to a DTS test access port ("TAP") controller (not shown), which provides the standard JTAG functionality of the debug test system 1100. The non-IEEE data and control signals 1140 couple to other logic within the debug test system that provides extended functionality beyond that provided by the DTS TAP controller.

Similarly, the target system ("TS") 1200 may comprise a TS cJTAG adapter 1210, a TS IEEE 1149.1 bus ("TS bus") 1220, and non-IEEE data and control signals 1240. The TS cJTAG adapter provides the logic necessary to convert the standard JTAG signals present on TS bus 1220 into the signals and message formats defined for cJTAG operation. The TS bus 1220 couples to a TS test access port ("TAP"; not shown), which provides the standard JTAG functionality of the target system 1200. The non-IEEE data and control signals 1240 couple to other logic within the target system that provides extended functionality beyond that provided by the TS TAP.

Debug test system 1100 is capable of sending test and debug sequences via link 1300 to target system 1200. These sequences allow debug test system 1100 to configure target system 1200 for a test, execute the test, and read back the results of the test. The debug test system 1100 may be configured to couple to the target system 1120 using a four or five wire implementation of link 1300 as defined under the JTAG architecture. The link 1300 includes signals TCK (clock), TMSC (mode select), TDI (data in), TDO (data out), and optionally RTCK (return clock). As shown, at least the TCK, TMSC, TDI and TDO signals can be used when the debug test system 1100 communicates with the target system 1210 according to the JTAG protocol. In this mode of operation, the signals from the DTS IEEE 1149.1 bus 1120 and the TS IEEE 1149.1 bus ("TS bus") 1220 are passed by DTS cJTAG adapter 1110 and TS cJTAG adapter 1210 without modification across link 1300.

The system 1000 also incorporates a variation of the JTAG architecture that provides an alternative physical interface that is designed to reduce the pin count of the interface between the debug test system 1100 and the target system 1200. This alternative configuration of the link 1300 allows the debug test system 1110 to communicate with the target system 1210 using only the TCK and TMSC signals of link 1300. In this mode of operation the TDI and TDO data are serialized together with the TMSC data and sent across the TMSC signal of link 1300 as a multi-bit serial message packet. Each packet may be either a control packet that is used to configure a component within the system 1000, or a data packet used to transfer data from one component to another. Although the TMSC signal is used for transferring the serial packet data in the preferred embodiment of FIG. 1, other signals (e.g., TDI and TDO) may be used and the present disclosure is intended to encompass all such embodiments.

Figure 2A:
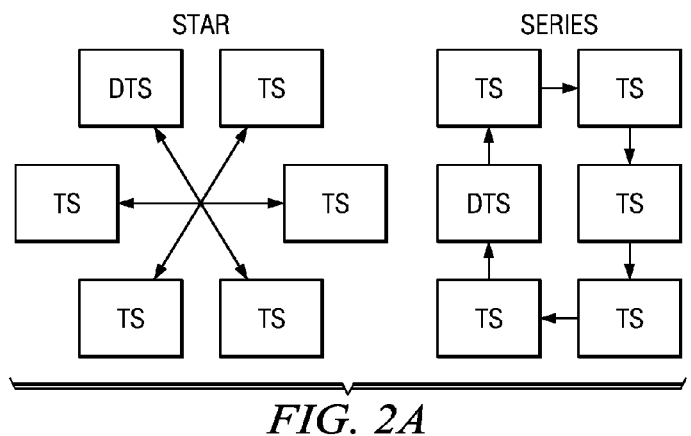
FIG. 2A illustrates star and series configurations that are possible within a cJTAG capable system in accordance with at least some preferred embodiments.
Figure 2B:
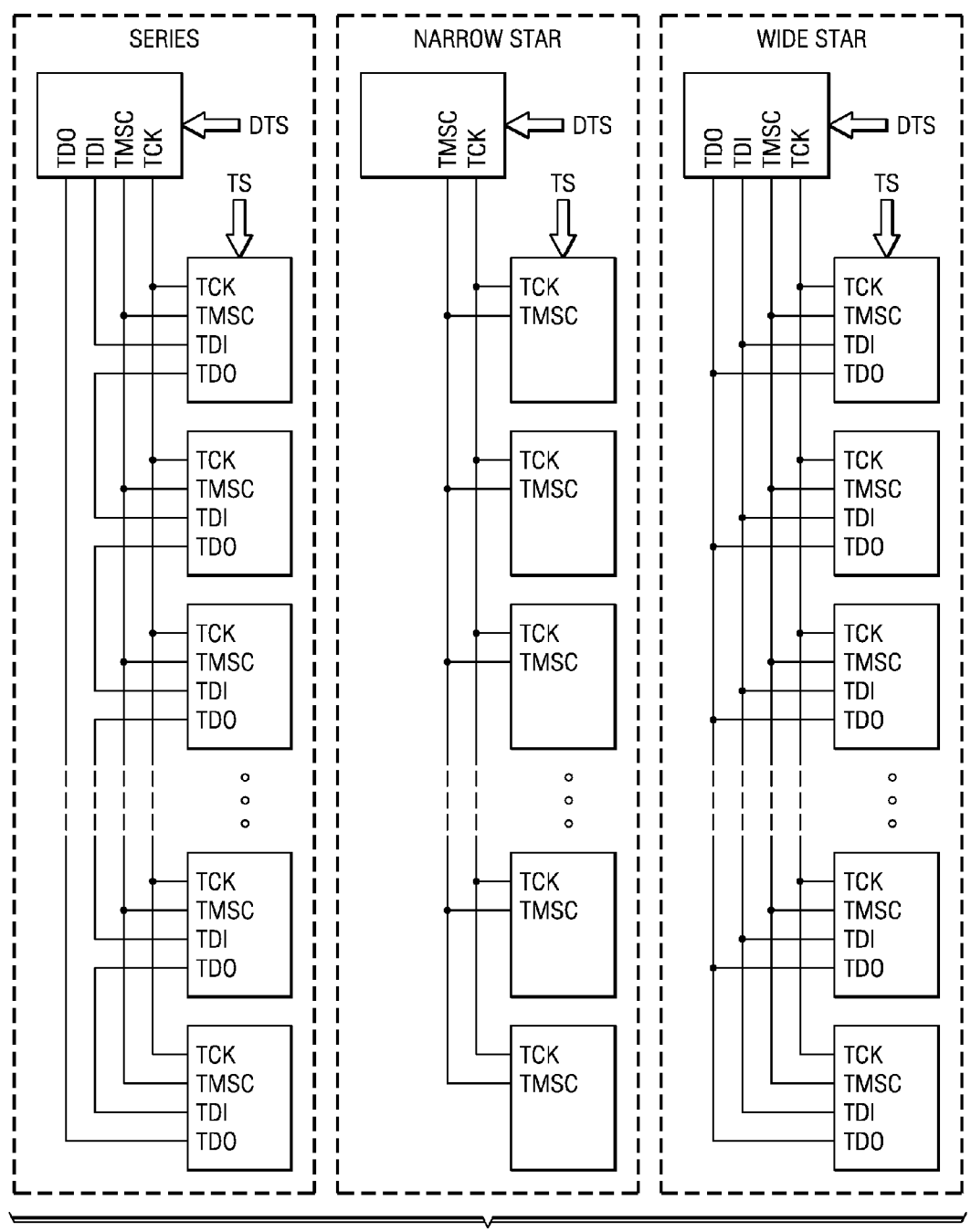
FIG. 2B illustrates series, narrow star and wide star configurations that are possible within a cJTAG capable system in accordance with at least some preferred embodiments.

FIG. 2A illustrates the two basic interconnect configurations for both JTAG and cJTAG systems. In the Star configuration, each target system may be accessed directly by the debug test system, while in the Series configuration the debug test system can only send data to, or receive data from, a target system through any and all intervening target systems. FIG. 2B illustrates how each of the two physical interfaces described above may used to couple a debug test system to one or more target systems. The Series configuration is allowed under both the JTAG architecture and permits mixing JTAG and cJTAG target systems. The Narrow Star and Wide Star configurations are only valid within the cJTAG architecture. The Narrow Star configuration includes the use, in at least one preferred embodiment, of only the TCK and TMSC signals. Both signals are shared by all of the target systems. cJTAG target systems that have a wide physical interface, and which are coupled to each other in either a Series or Wide Star configuration, may optionally operate as if configured to operate in a Narrow Star mode, as shown in FIG. 2C.

It should be noted that throughout this disclosure a distinction is made between the TMS bit that is defined in the IEEE standard and the TMSC signal of the link 1300. When operating the system according to the standard JTAG protocol, the TMS bit is the only bit transmitted using the TMSC signal. But when the system is operating according to the cJTAG protocol, the TMS bit is just one of several bits that may be transferred across the link 1300 using the TMSC signal. Thus, to differentiate between the two, the bit is referred to as the TMS bit, while the signal of the link is referred to as the TMSC signal.

Referring again to FIG. 1, both DTS cJTAG adapter 1110 and TS cJTAG adapter 1210 appear to continue to operate according to the standard four or five wire JTAG protocol when viewed from either the DTS bus 1120 or the TS bus 1220. The cJTAG adapters 1110 and 1210, together with link 1300, thus provide an abstraction layer or bridge that hides the underlying 2-wire cJTAG physical interface. This bridge can operate according to the JTAG protocol ("IEEE mode"), or can alternatively operate according to the cJTAG protocol ("advanced mode") in a manner that is transparent to DTS bus 1120, TS bus 1220 and other portions of the debug test system and target systems that operate exclusively in IEEE mode. When operating in advanced mode, data and control information may be exchanged with the DTS cJTAG adapter 1110 via either DTS bus 1120 or non-IEEE data and control signals 1140. Likewise, data and control information may be exchanged with TS cJTAG adapter 1210 via either TS bus 1220 or non-IEEE data and control signals 1240 when operating in advanced mode.

FIG. 3 provides an alternative illustration of the system 1000 that includes DTS IEEE 1149.1 TAP controller ("DTS TAP controller") 1130 and TS IEEE 1149.1 TAP ("TS TAP") 1230. DTS TAP controller 1130 couples to DTS cJTAG adapter 1110 via DTS bus 1120, and TS TAP 1230 couples to TS cJTAG adapter 1210 via TS bus 1220. The system 1000 of FIG. 3 can select between IEEE mode and advanced mode in one of at least two ways. First, the operational mode of the system 1000 can be selected when the system is first powered up. Upon initial power-up, the system 1000 asserts a power-on-reset signal that sets all components within the system to a known default state. The cJTAG adapters 1110 and 1210 both initially default to IEEE mode. In the preferred embodiment of FIG. 1, the TMS bit is held at a zero state while the TDO bit is sequenced through a pattern that causes the cJTAG adapters, which monitor the TDO bit, to transition into advanced mode.

Figure 4:
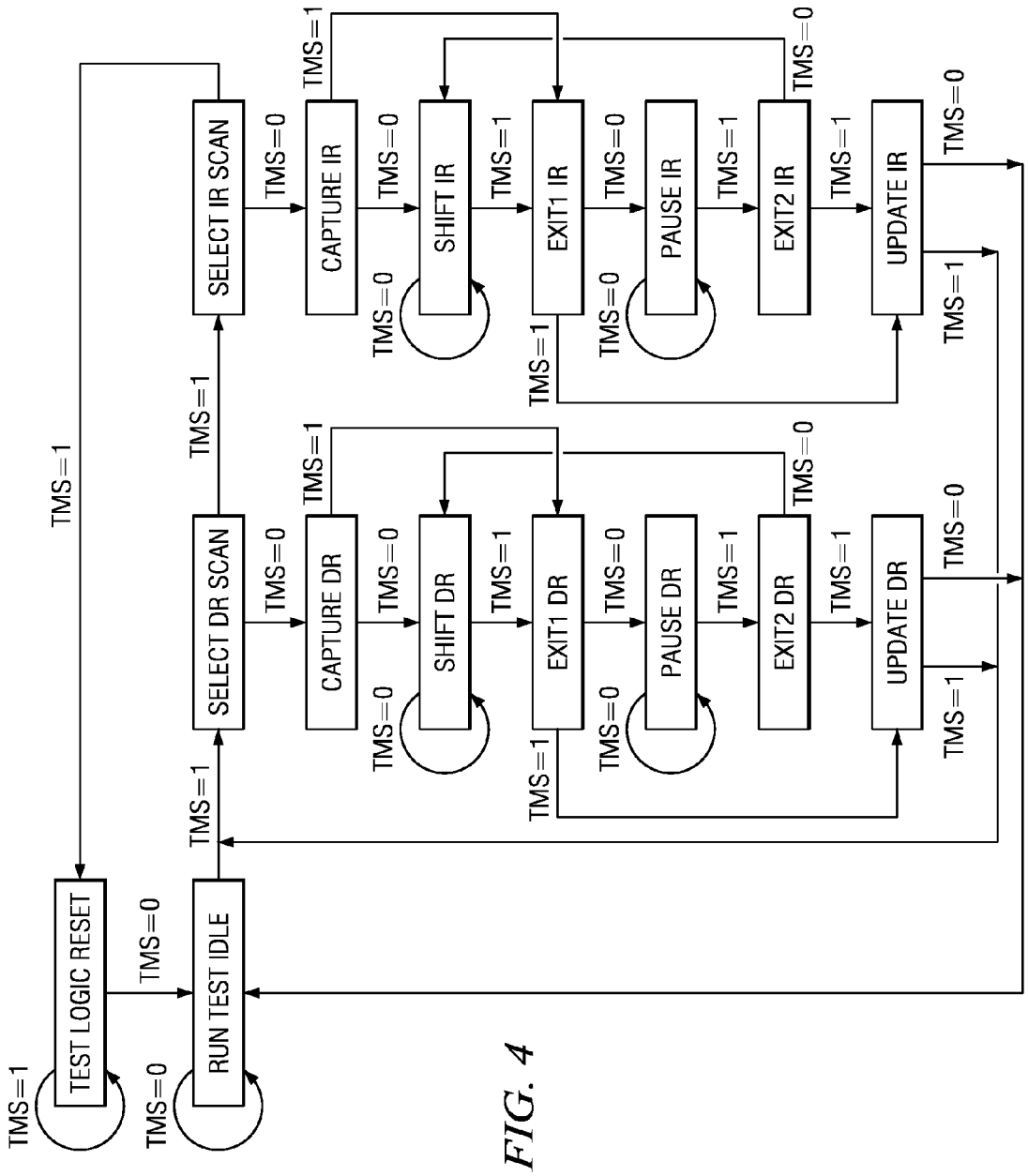
FIG. 4 illustrates the state transition diagram for a TAP state machine within a cJTAG capable system in accordance with at least some preferred embodiments.

FIG. 4 shows the state transition diagram implemented by the state machine of TS TAP 1230 in accordance with IEEE standard number 1149.1. Sixteen states are shown and transitions from one state to another are effectuated by transitions of the TMS bit. As can be seen in FIG. 4, holding the TMS bit to a binary zero causes the TS TAP 1230 to transition from the Test-Logic-Reset state to the Run-Test/Idle state, where it stays as long as the TMS bit is held to a logical zero. The preferred binary pattern for the TMS bit that is used to trigger the advanced mode is "0111111011111110111111." When the TS cJTAG adapter 1210 detects this particular predetermined sequence of TMS bit values, the TS cJTAG adapter 1210 begins operating in the advanced mode. This pattern for the TMS will cause the state machine of the TS TAP 1230 to transition through the states of the state machine without passing through either the shift_DR or shift_IR states. By avoiding these states, data is not moved in or out of any of the standard JTAG data or instruction registers, which freezes the JTAG configuration of the target system 1200. Thus, activating advance mode operation of the TS cJTAG adapter 1210 has no effect on the TS TAP 1230.

Figure 5:
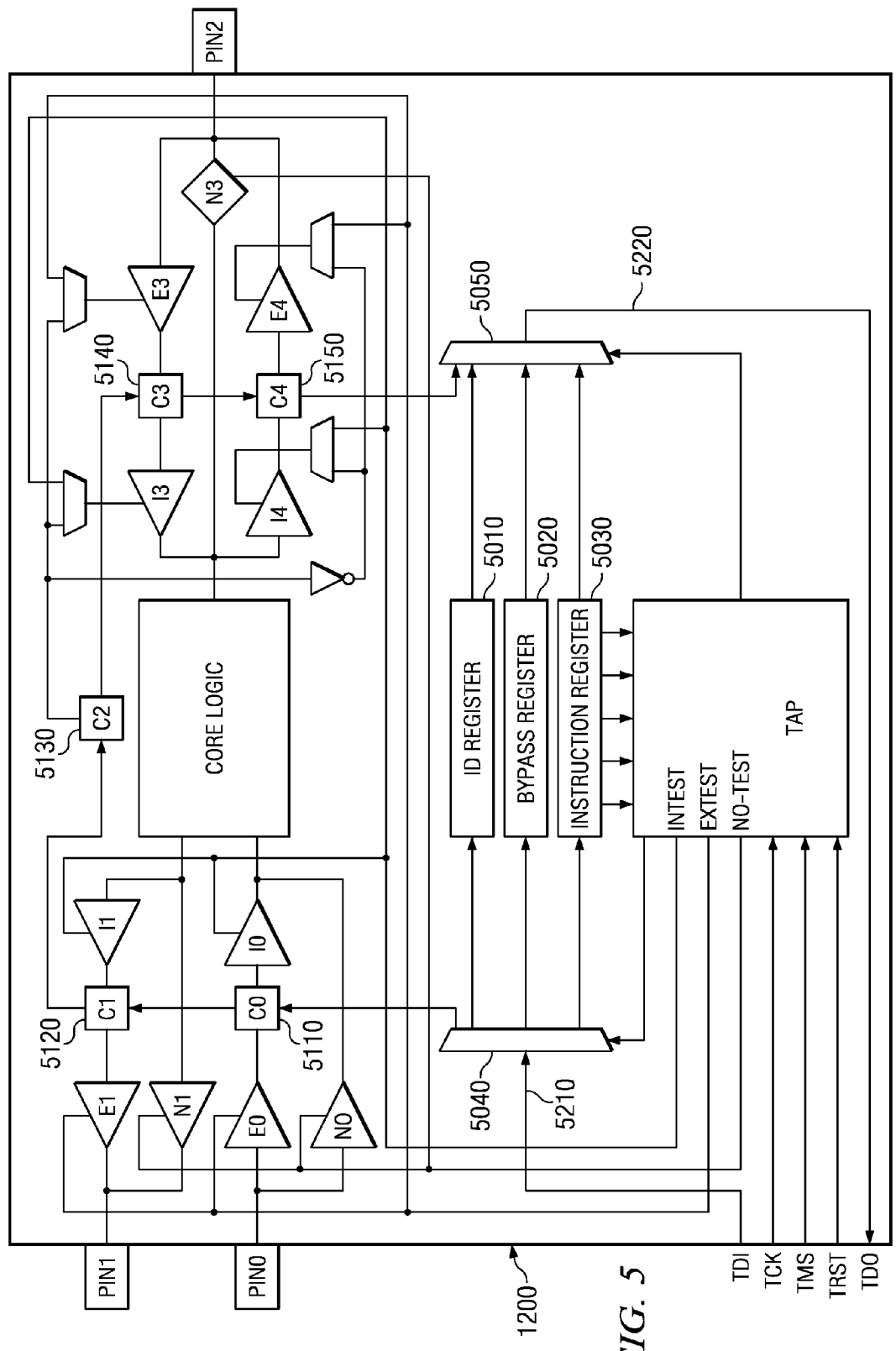
FIG. 5 illustrates a high-level schematic of a JTAG target system in accordance with at least some preferred embodiments.

The second way in which the system 1000 of FIG. 3 can select between IEEE mode and advanced mode is through the use of "inert" JTAG data scans after the system is past power-on reset and is operational. Inert data scans are JTAG data scans that do not do anything useful and thus are not normally used. Normally a JTAG data scan includes a fixed series of operations designed to accomplish a useful function, such as reading or loading a JTAG data register within the target system 1200. FIG. 5 illustrates at least some of the data registers within the target system 1200 that are accessible by the TS TAP 1230, in accordance with at least some preferred embodiments. These include the ID register 5010, the bypass register 5020, and a collection of input cell, output cell and enable cell registers 5110 through 5150. To load a register, for example, the register scan operation type (data or instruction) is first selected, and the current contents of the destination register (e.g., the bypass register) are then moved to the output shift register of register output multiplexer 5050 though a capture operation. Next, a series of shift operations are performed wherein new data is shifted into the input shift register of register input demultiplexer 5040 from the TDI input 5210 and old data is simultaneously shifted out the TDO output 5220. Finally, an update operation is performed to transfer the new data from the input shift register of register input demultiplexer 5040 to the actual register to which the data is destined.

Figure 6A:
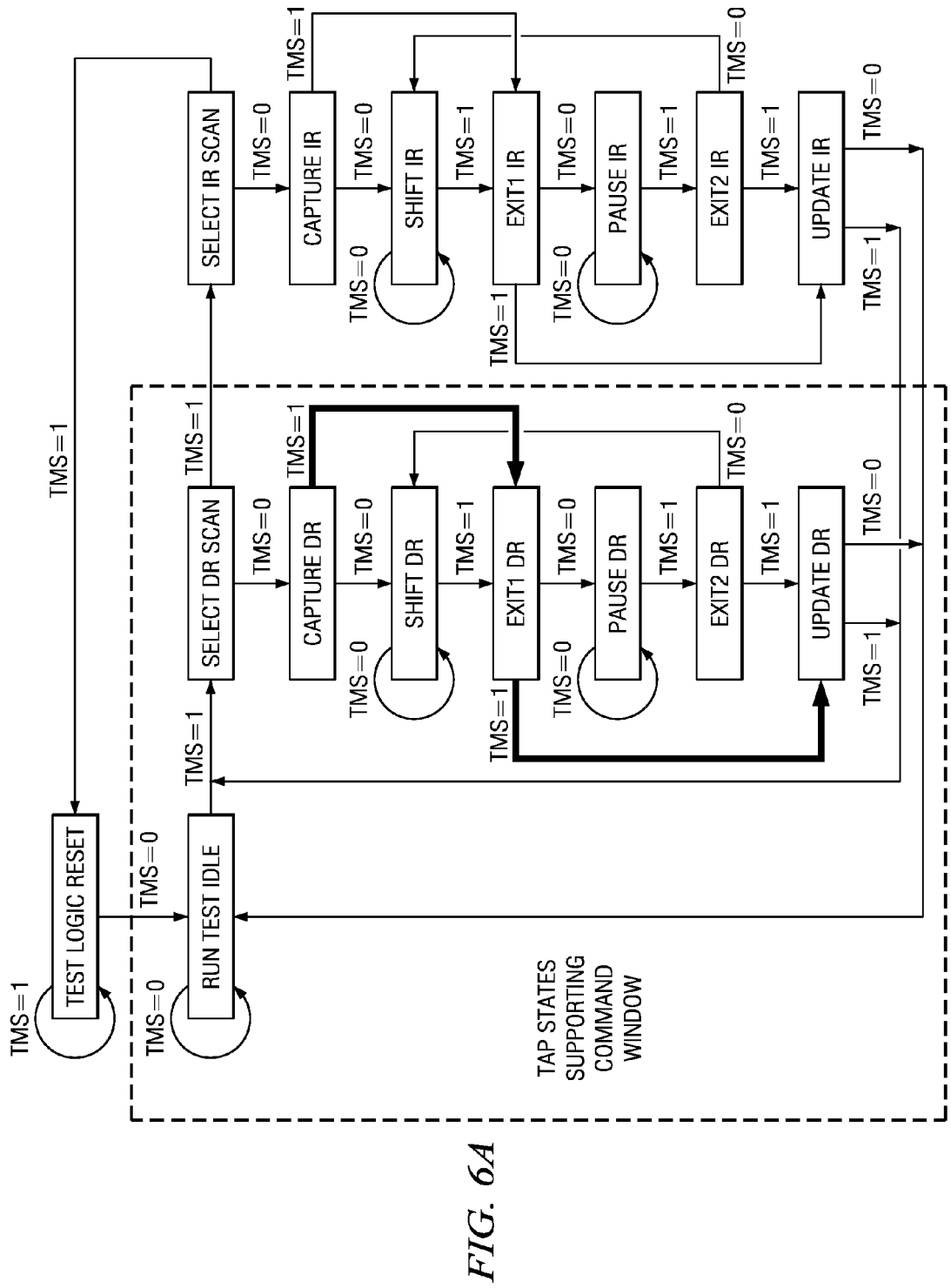
FIG. 6A illustrates a first example of an inert state usable to enter into an advanced mode of operation in accordance with at least some preferred embodiments.
Figure 6B:
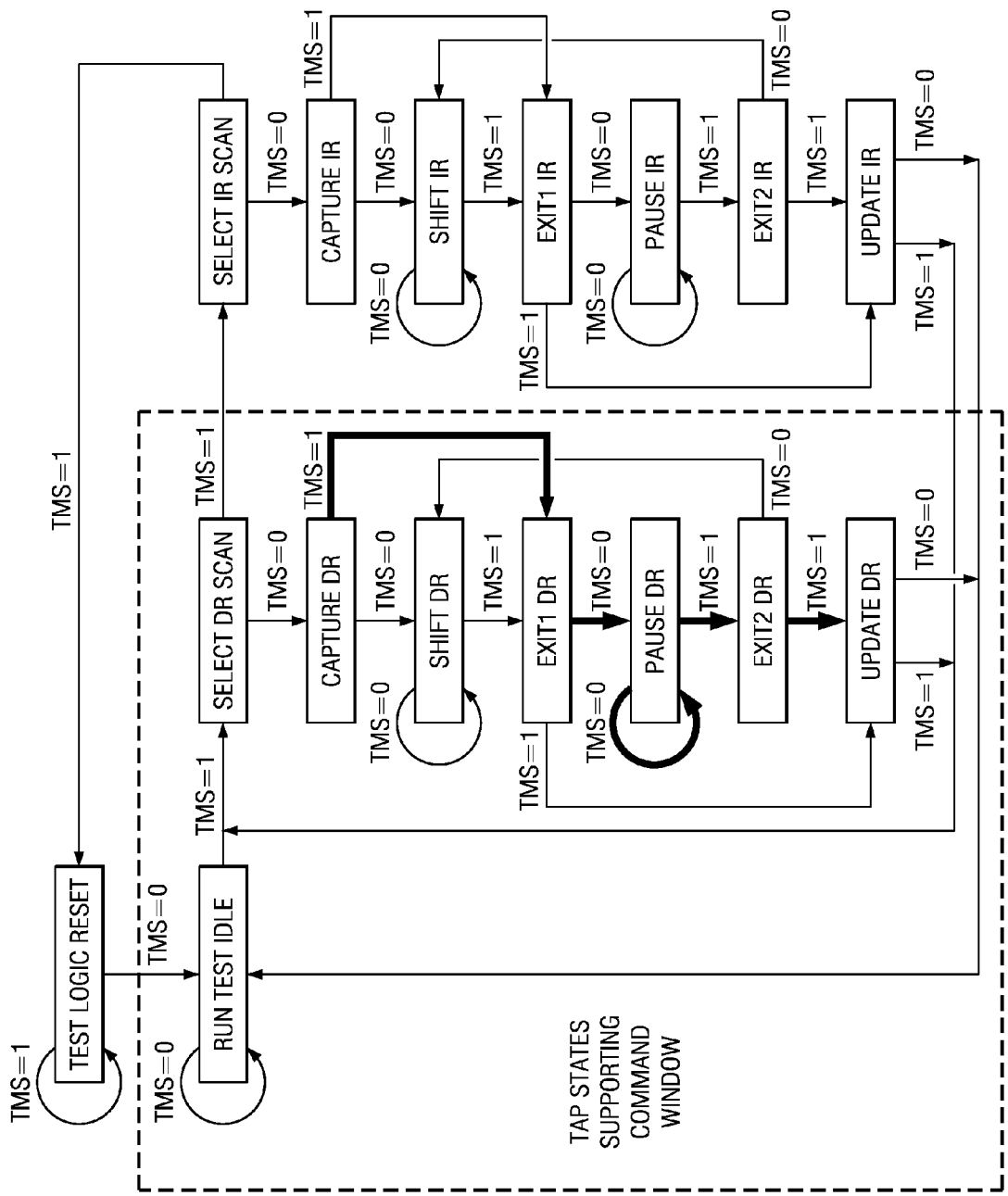
FIG. 6B illustrates a second example of an inert state usable to enter into an advanced mode of operation in accordance with at least some preferred embodiments.

FIGS. 6A and 6B illustrate how inert JTAG data scans may be used to transition through the TAP state transition diagram without actually loading a value. As can be seen, all of the operations that would normally take place in, for example, a register scan to load a register take place, except for the sequence of shift operations. In FIG. 6A, the sequence of states (shown shaded) includes the Capture_DR state, the Exit1_DR state, and the Update_DR state. Similarly, in FIG. 6B the sequence of states include the Capture_DR state, the Exit1_DR state, the Pause_DR state, the Exit2_DR state, and the Update_DR state.

In each of the sequences of FIGS. 6A and 6B, the capture operation causes the current value of the destination register to be transferred to the output shift register of register output multiplexer 5050, and the update operation causes the value in the input shift register of register input demultiplexer 5040 to be loaded into the destination register. But without intervening shifts, all of the registers end up containing the same value, which is the value that was already in the input shift register of register input demultiplexer 5040 and the destination register. As a result, no data is transferred in or out of the target system 1200, and the contents of the destination register remain unaltered. Because no data bits are shifted in or out of the target system 1200, the inert scans are referred to as "zero-bit" scans ("ZBS"). FIG. 6C summarizes the relevant TAP states that together each define an example of a zero-bit scan. Although two examples are shown, many others are possible and all such sequences of states that define a zero-bit scan are intended to be within the scope of this disclosure.

Figure 7:
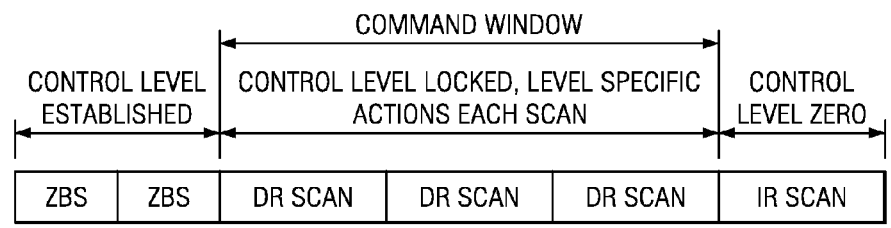
FIG. 7 illustrates the format of an advanced mode command window in accordance with at least some preferred embodiments.

Because zero-bit scans do not corrupt the contents of the JTAG registers, they can be used to cause the DTS and TS cJTAG adapters to enter into the advanced mode of operation. Once in the advanced mode of operation, the debug test controller 1100 of FIG. 3 communicates directly through the DTS cJTAG adapter 1110, bypassing the DTS TAP controller 1130. Similarly, cJTAG sequences received by the TS cJTAG adapter 1210 after entering the cJTAG mode of operation are not passed onto the TS TAP 1230, but are instead acted upon directly by the TS cJTAG adapter 1210. Operation of the DTS and TS cJTAG adapters 1110 and 1210 in advanced mode continues until an event that terminates the current sequence of operations and transitions the DTS and TS cJTAG adapters 1110 and 1210 back to IEEE mode. In the preferred embodiment of FIG. 3, termination of operations within advanced mode is accomplished by performing an instruction register select operation. By establishing clear entry and exit sequences in and out of advanced mode, a cJTAG command window is defined that starts with, for example, one or more zero-bit scans, followed by cJTAG sequences (data register scans are used in the preferred embodiment of FIG. 3), and ending, for example, with an instruction register scan. The structure of such a scan sequence and the resulting command window are illustrated in FIG. 7.

Because a zero-bit scan is essentially a no operation (no-op) to the DTS TAP controller 1130 and the TS TAP 1230, any number of zero-bit scans may be executed one after the other. The ability to send any number of consecutive zero-bit scans allows multiple tiers of capabilities or "control levels" to be defined. Each control level corresponds to the number of consecutive zero-bit scans, and each control level enables a different set of capabilities. FIG. 7 illustrates an example of a command window in which two zero-bit scan sequences open a command window. The two zero-bit scans that are used to open the window are also used to designate the control level as control level 2. FIG. 8A shows an example, in accordance with at least some preferred embodiments, of different capabilities being allocated to each control level. The example shows that control levels 1-5 are allocated to the cJTAG protocol (with control levels 4 and 5 being reserved). Control level 0 represents IEEE mode (JTAG protocol), and control levels 6 and above are user defined levels available for extended capabilities beyond those defined for the cJTAG protocol of the preferred embodiments described herein. Other extended capabilities and other control levels will become apparent to those skilled in the art, and the present disclosure is intended to encompass all such capabilities and control levels.

Because only zero-bit scans (which do not include TDO or TDI) are used within a command window, shift_DR commands cannot be used to specify data while in a non-IEEE mode control levels (above level 0 in the preferred embodiments). Instead, consecutive shift_DR commands are performed within the command window, and the number of shift_DR operations is counted. This count is saved, and after the command window is closed, the saved count is used as data to specify the particular advanced mode command desired, as well as any data for the command if applicable. FIG. 8B illustrates an example of counts used to define advanced mode commands in this manner. Although the example shown in FIG. 8B uses a 5-bit data width, any number of bits may be encoded in this manner and the present disclosure is intended to encompass all bit widths.

Figure 9:
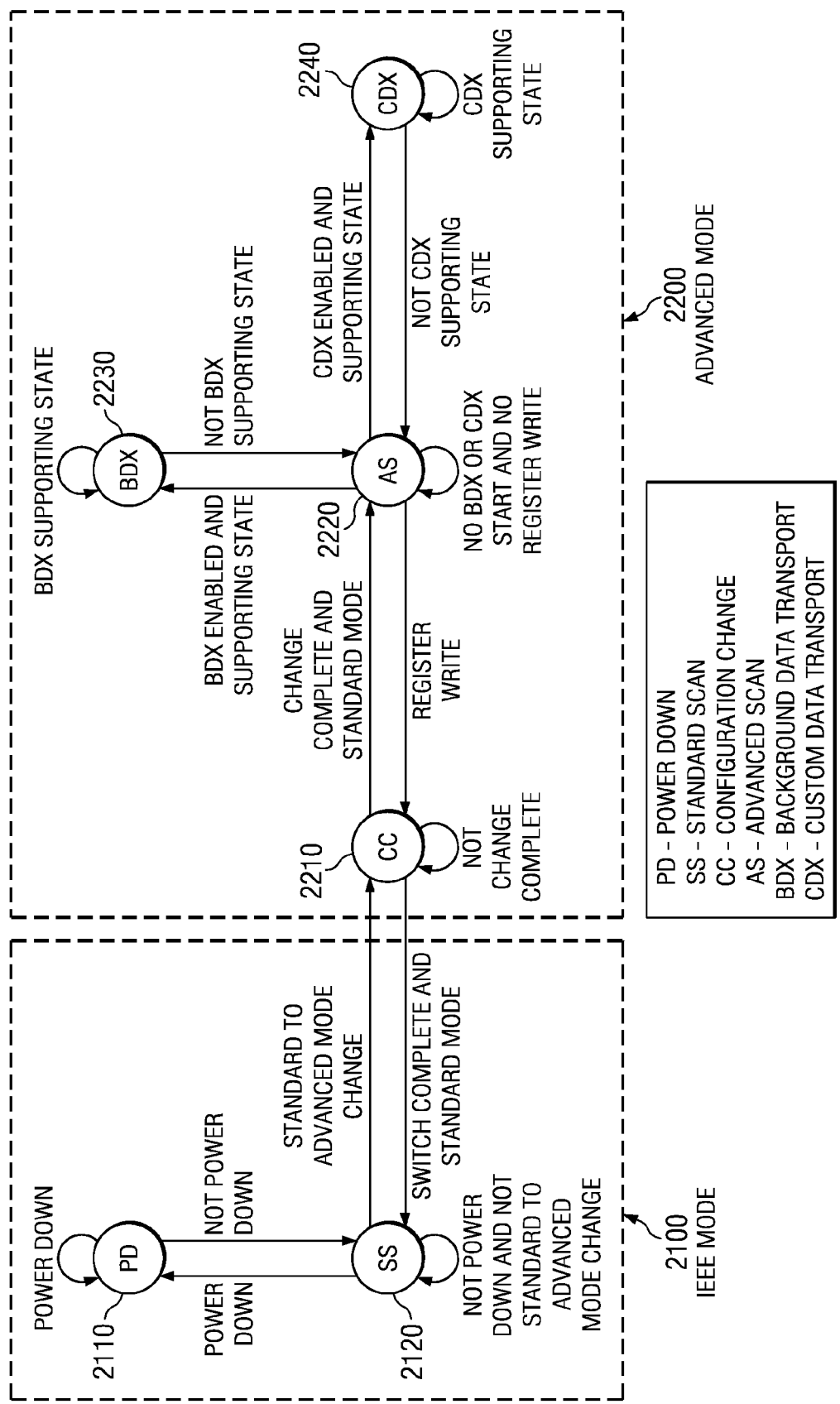
FIG. 9 illustrates a simplified state transition diagram showing the transitions between IEEE mode and standard mode in accordance with at least some preferred embodiments.

As already noted, the preferred embodiment of FIG. 3 is capable of multiple modes of operation. FIG. 9 illustrates a simplified scan state diagram 2000 that shows the modes of operation of the state machine implemented within the DTS and TS cJTAG adapters 1110 and 1210 of the system 1000 (FIG. 3), in accordance with at least some preferred embodiments. Two modes are defined: standard (IEEE) mode 2100 and advanced mode 2200. The system starts up with the state machines of the cJTAG adapters in the power down ("PD") state 2110 and after powering up in IEEE mode is capable of performing standard (IEEE) JTAG scans within standard scan ("SS") state 2120. The cJTAG adapters can change modes by transitioning through the configuration change ("CC") state 2210. After entering the advanced mode, basic cJTAG scans may be performed within advanced scan ("AS") state 2220. Other extended operations may be added to the basic cJTAG scans, and two such extended operational states are shown (background data transfer or "BDX" state 2230, and custom data transfer or "CDX" state 2240). The cJTAG adapters may be powered down after the state machines transition through the configuration state 2210 and the standard scan state 2120 and back to the power down state 2110.

Figure 10A:
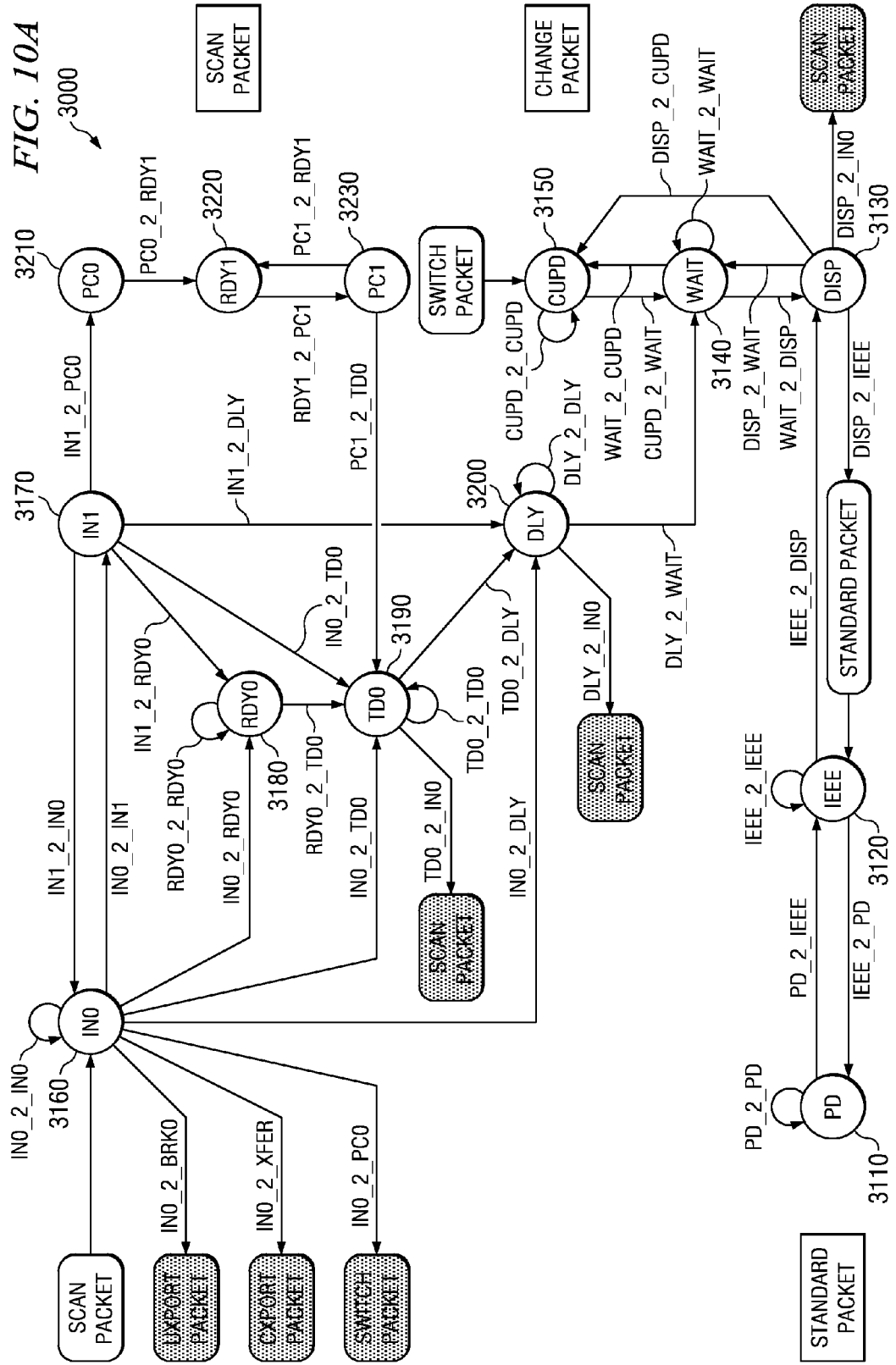
FIGS. 10A and 10B illustrate a state transition diagram for a cJTAG adapter in accordance with at least some preferred embodiments.
Figure 10B:
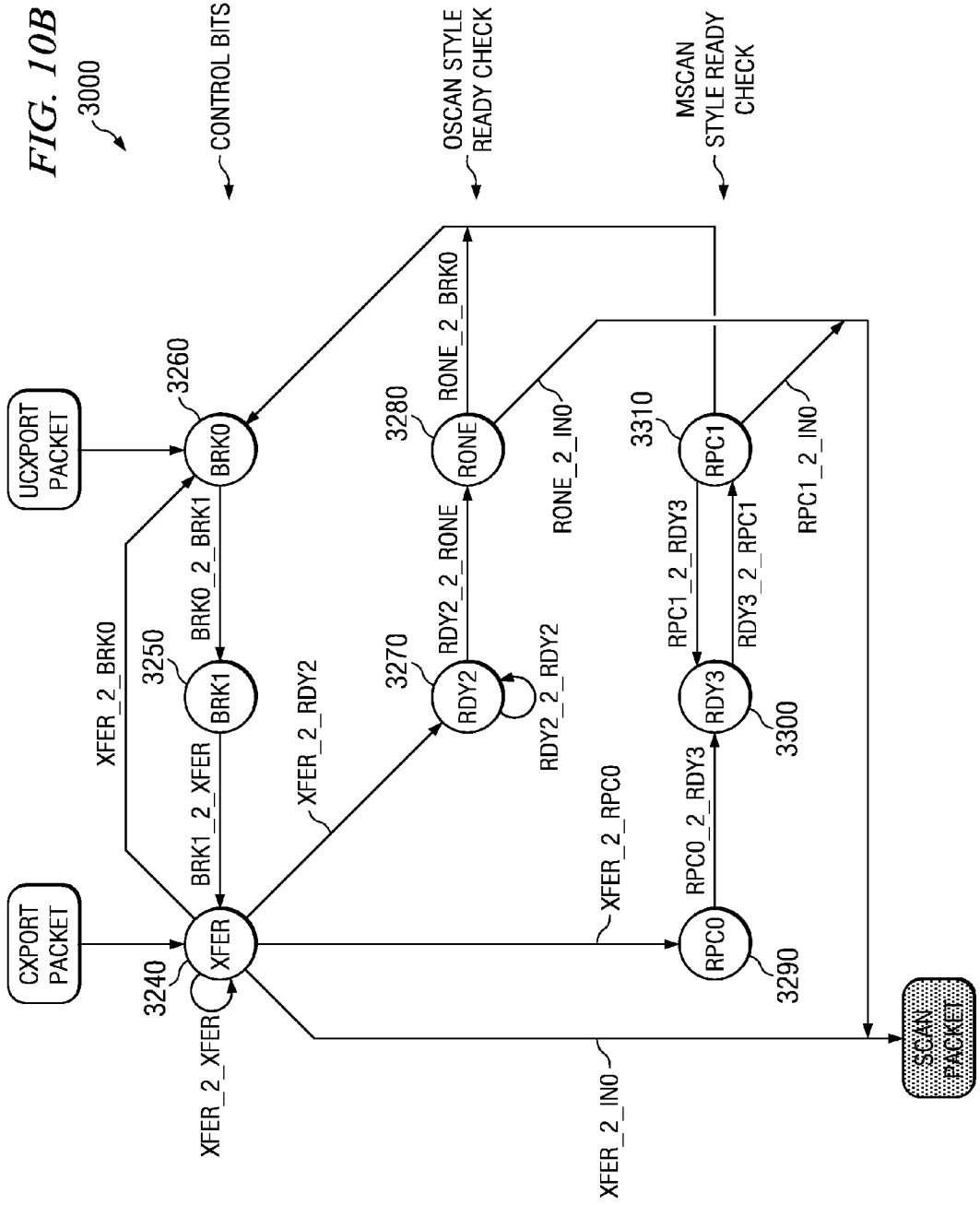

FIGS. 10A and 10B illustrate a more detailed cJTAG adapter scan state diagram 3000, in accordance with at least some preferred embodiments. Referring to FIG. 10A, the state machines of the TS cJTAG adapter 1220, for example, starts up in the power down ("PD") state 3110, transitioning to the standard mode idle ("IEEE") state 3120 after completing a power-on reset. When the TS cJTAG adapter 1220 receives a packet while in standard mode, the state machine transitions to the dispatch ("DISP") state 3130. If the packet is a standard scan packet, the packet is forwarded to the TS TAP 1230 without modification by the TS cJTAG adapter 1220, and the state machine returns to the standard mode idle state 3120. If the packet is a change packet (i.e., the beginning of a command window indicating a change from IEEE mode to advanced mode), the change packet is processed, transitioning through change update ("CUPD") state 3150, wait state 3140 and dispatch state 3130, and into the advanced mode idle ("IN0") state 3160.

When a cJTAG adapter receives an incoming packet while in IEEE mode, the state machine may transition to one of a variety of states depending on the type of packet received. If the packet is an advanced scan packet, the state machine transitions through at least some of states 3170-3230 in a manner that depends on the advanced scan type. These scan types and their relationships to the state diagram are described in more detail below. If the packet is either a compressed export (CXPORT) packet or an uncompressed export (UXPORT) packet, the state machine transitions through at least some of states 3240-3310 (FIG. 10B). These data export operations and their relationships to the state diagram are described in more detail below. If the packet is a change packet (e.g., the end of a command window indicating a change from advanced mode back to IEEE mode), the change packet is processed, transitioning again through change update state 3150, wait state 3140 and dispatch state 3130, and back to the IEEE mode idle state 3120.

As already noted, the 2-wire physical interface provided under the cJTAG architecture requires that the data transferred across 4 or more wires be sent across the interface in the form of a serialized message packet. Data that would be sent across these wires under the JTAG architecture is instead sent as individual data bits within a cJTAG message packet. An example of such a serialized message packet is shown in FIG. 11. The packet shown includes bits representing the TDI, TDO and TMS signals of the JTAG interface, as well as additional bits used to implement additional features such as interlocked communications and delays. Not all operations require all of the bits shown in FIG. 11. To avoid sending bits that are not needed for a particular operation, at least some of the preferred embodiments define a plurality of scan types, each with different packet contents depending on what bits are to be used. By varying the bits included in the packet, different levels of optimization are possible.

Figure 12A:
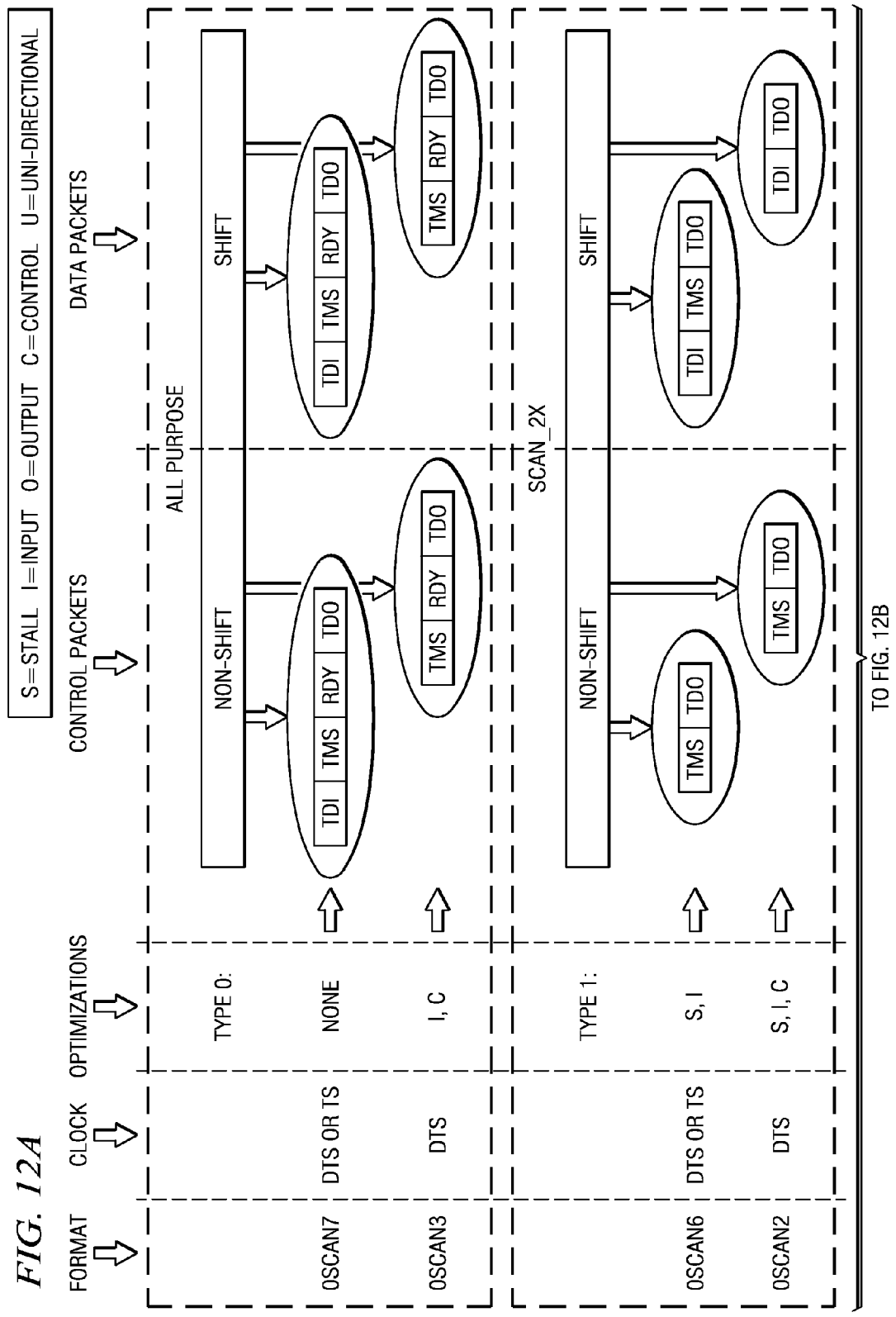
FIG. 12 illustrates examples of several different optimized scan message formats in accordance with at least some preferred embodiments.
Figure 12B:
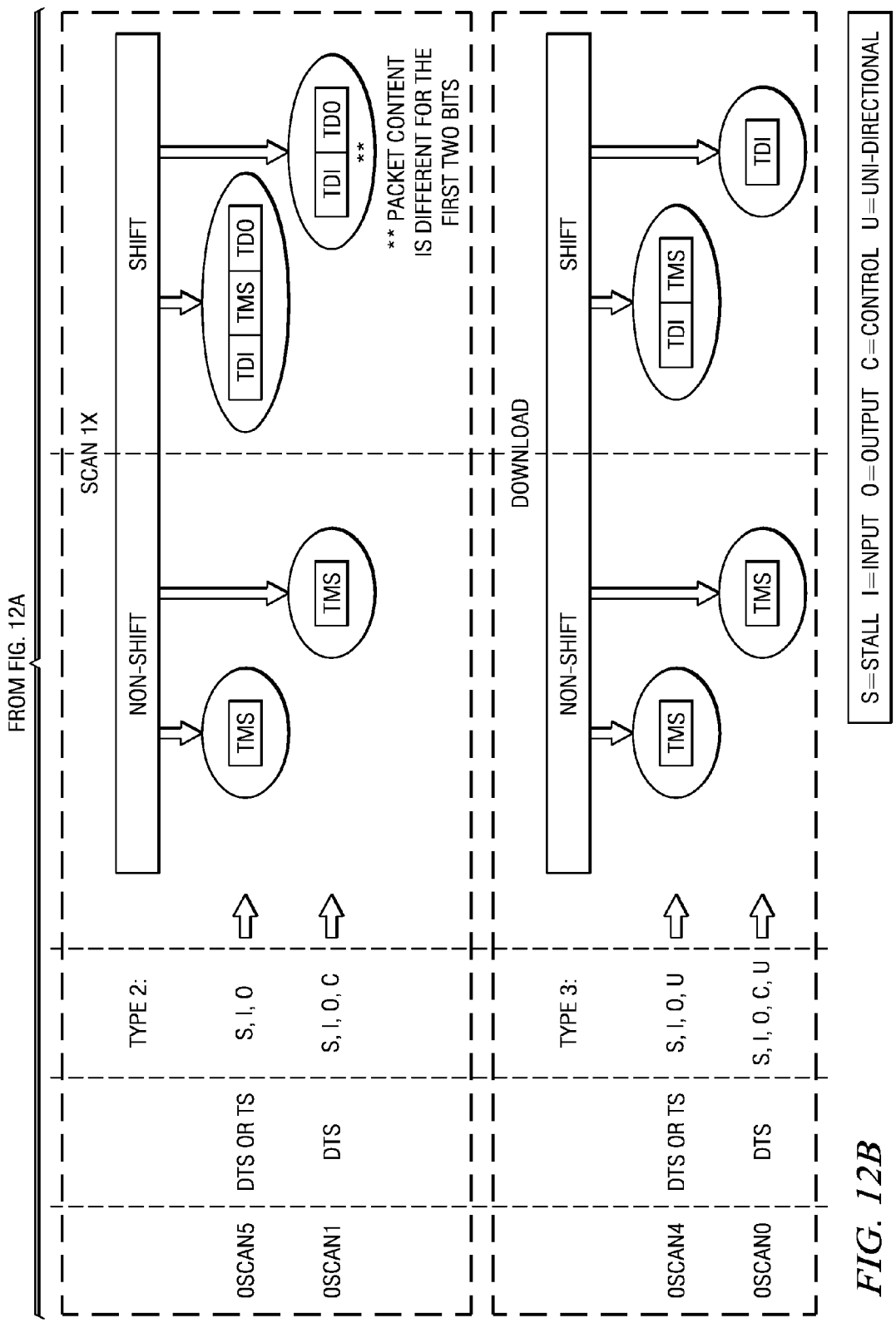

FIG. 12 illustrates several examples of optimized scans ("OScans"), in accordance with at least some preferred embodiments. Each of the OScans shown provides different combinations of bits, and thus different levels of optimization. For each Oscan, the chart indicates whether the clock is sourced by the debug test system or the target system, which bits are eliminated when not needed, and what the resulting control and data packets look like as a result of the optimization. The decision of when to omit a bit and utilize a particular OScan is based upon the JTAG standard, which specifies which bits are needed for particular operations defined by the TAG state diagram (FIG. 4).

OScan7 preferably provides no optimization and includes bits representing all of the signals of the JTAG architecture, plus a "ready" bit and one or more optional delay bits. This accounts for JTAG implementations that may not have followed the JTAG architecture as defined within the IEEE standard by, for example, transferring data on TDO or TDI during operations when the standard specifies that these signals are not used. Thus, OScan7 is provided for compatibility purposes, and not to result in any actual optimization.

Each of the remaining OScans results in a reduction in the number of bits transferred. In each case a given bit can be omitted because it is not needed for a given type of transaction. If, for example, data only needs to be transferred from a target system to the debug test system, there is no need to include the TDI bit which is used to transfer data from the debug test system to the target system. Similarly, the TDO bit is not needed for transfers from the debug test system to a target system. Ready bits (described below) are not needed if the target system is fast enough to keep up with the debug test system at the full TCK clock rate. TMS is not needed for long data transfers where an end of transfer escape sequence can be used (described below).

Referring again to FIG. 12, Oscan6 omits the TDI and ready bits from control packets and the ready bit from data packets. OScan5 omits all but the TMS bit from control packets and the ready bit from data packets. OScan4 omits all but the TMS bit from control packets and omits the TDO and ready bits from data packets. OScan3 omits the TDI bit from control packets and the TMS bit from data packets. OScan2 omits the TDI and ready bits from control packets and the TMS and ready bits from data packets. OScan1 omits all but the TMS bit from control packets and omits the TMS and ready bits from the data packets. OScan0 omits all but the TMS bit from control packets and all but the TDI bit from data packets. The delay bits are optional for all of these packets. Although some of the formats described may be capable of one bit per data packet, two bits per data packet is a preferred configuration, as it permits maintaining a 2-to-1 ratio between cJTAG link clock and the JTAG clock on the IEEE busses (see FIG. 1). This permits the link to continue to operate at relatively high clock rates even when the debug test system, the target system, or both are slower, legacy systems.

Figure 13:
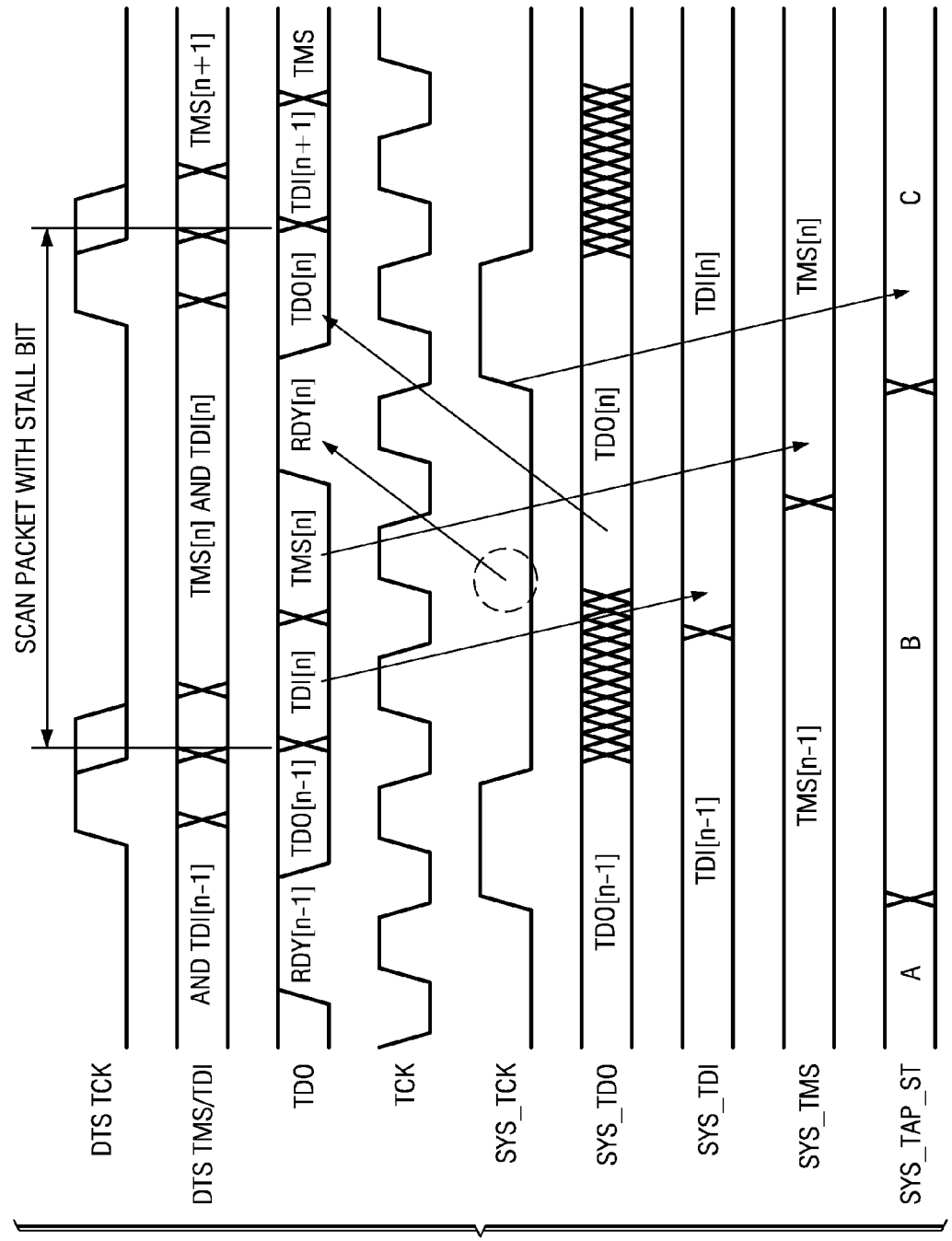
FIG. 13 illustrates the timing diagram for an example of an optimized scan without a scan stall in accordance with at least some preferred embodiments.
Figure 14:
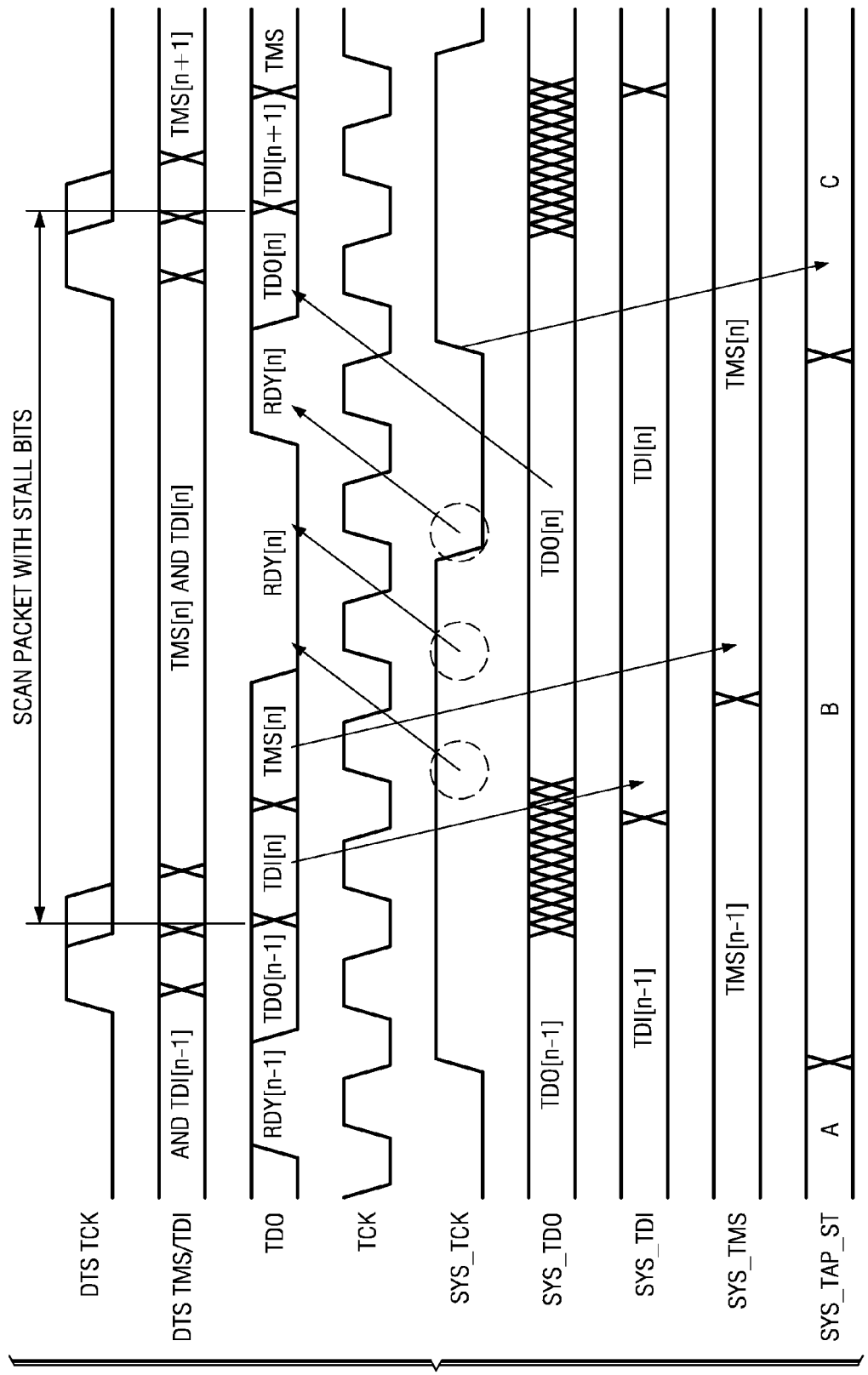
FIG. 14 illustrates the timing diagram for an example of an optimized scan with a scan stall in accordance with at least some preferred embodiments.

The OScans of the preferred embodiments also provide additional capabilities beyond the base JTAG architecture through the use of a ready bit. Because the data transferred between the debug test system and the target system in the cJTAG architecture is a serialized version of the signals defined in the JTAG architecture, it may be desirable to clock the serialized data at a higher clock rate to offset the effect of the serialization. But some legacy debug test systems that use an external cJTAG adapters may not be fast enough to keep up with the higher clocking rates of the cJTAG architecture. The ready bit provides a means for holding off or "stalling" the target system and keeping it from outputting the TDO bit until the debug test system is ready. As shown in FIG. 13, if the ready bit is set, the next bit sent is the TDO bit from the target system. FIG. 14 illustrates the case where the target still stalls the debug test system. The ready bit is cleared, and the next bit sent is a repeat of the ready bit rather than the TDO bit. The ready bit continues to be repeatedly sent until the ready bit is cleared, at which point the TDO bit is sent from the target system to the debug test system.

The operation of the ready bit is also shown in the scan state transition diagram of FIG. 10A. When a scan packet that includes a ready bit is received in advanced mode the state machine of a cJTAG adapter receiving the packet can transition from advanced mode idle state ("IN0") 3160, where it process the first packet bit, to either input/output processing state ("IN1") 3170, where it would process the second packet bit if included, or to the OScan ready state ("RDY0") 3180. If there is no second packet bit prior to the ready bit, the state machine can transition directly from the advanced mode idle state 3160 to the OScan ready state 3180. If the ready bit is not set, the state machine will hold in the OScan ready state 3180. Once the ready bit is set, the state machine then transitions to the TDO processing state ("TDO") 3190.

The OScans of the preferred embodiments may also provide for additional transmission delays through the use of delays between packets. Either a fixed or variable number of delay cycles may be introduced between the end of one packet and the beginning of another packet. FIG. 15A illustrates the transmission of a fixed delay. In the example shown, a fixed delay of two clock cycles (TCK cycles) is introduced between two scan packets. In at least some of the preferred embodiments, the duration of the clock cycles is determined by programming two bits within a cJTAG delay control register within the cJTAG adapter of the debug test system. A delay of 0, 1, and 2 clock cycles may be selected by setting the delay control bits, for example, to the binary values 00, 01, and 10 respectively, as shown in the table of FIG. 15B. Each value corresponds to the addition of 0, 1, or 2 clock cycles of delay. Thus, in the example show in FIG. 15A, the delay control register was set to a binary value of 10 (decimal 2), resulting in the two additional delay periods shown.

Figure 16B:
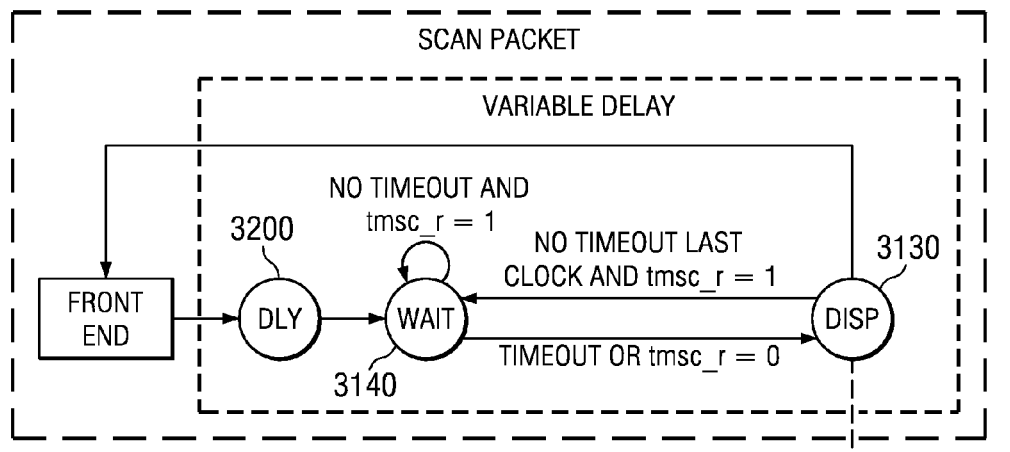
FIG. 16B illustrates the state transition diagram for extending a delay between scan messages in accordance with at least some preferred embodiments.

FIG. 16A illustrates how delays between packets that are of variable length may also be provided. In at least some of the preferred embodiments, loading a binary value of 11 into the a cJTAG register control registers enables variable delays and configures the delays between packets to be controlled by the state of the TMS bit. The sequence of events is shown in FIG. 16B, which is a simplified partial state transition diagram derived from the scan state transition diagram of FIG. 10. After the initial delay state ("DLY") 3200 is reached, the state machine of the cJTAG adapter transitions to wait state ("WAIT") 3140. As long as the TMS bit is set, the state machine will remain in wait state 3140. When the TMS bit is cleared, the state machine will transition to the dispatch state 3130 and the cJTAG adapter will then resume processing advanced mode scan packets if the TMS bit remains cleared.

In at least some of the preferred embodiments a timeout mechanism is included that forces the state machine of FIG. 16B to reset all cJTAG control registers to their power-on reset values and return the cJTAG state machine to IEEE mode. The criteria for triggering this timeout is based on a predetermined number of consecutive clock cycles (e.g., 64 clock cycles) during which the TMS bit remains a one. If the TMS bit stops transitioning at least one of the cJTAG adapters is presumed to have stopped operating properly, warranting a reset of the cJTAG interface. As described above, variable delays are achieved by holding the TMS bit to a one. The timeout mechanism thus limits a variable delay cycle to less than the timeout clock count.

To extend the delay times that are possible, at least some of the preferred embodiments implement a delay extension mechanism, which is also shown in FIG. 16B. Assuming, for example, a timeout above 64 consecutive clock cycles, if the TMS bit is held high for no more than 64 clock cycles, thus transitioning the state machine from the wait state 3140 to the dispatch state 3130 on the 65$^{th}$ clock cycle, the TMS cycle may be set to a one again, sending the state machine back to wait state 3140. No timeout will occur and the delay has now been extended for up to another 64 clock cycles. This extension sequence may be repeated as many times as necessary.

As already noted, the purpose of the OScans is to provide a way for transmitting only that data that is needed and omitting bits of data that are not needed for a particular transaction. For bits like TDI and TDO this means not including the information within the packet. But unlike the TDI and TDO bits, the TMS bit is used to determine the state transitions that occur in both the TAP and cJTAG state machines. For OScans that include the TMS bit, the TMS bit is held low until the end of the transfer, and then set high during the last packet. For OScans where the TMS bit is excluded, at least some of the preferred embodiments use an alternative mechanism that signals the end of the transfer without using the TMS bit.

Figure 17:
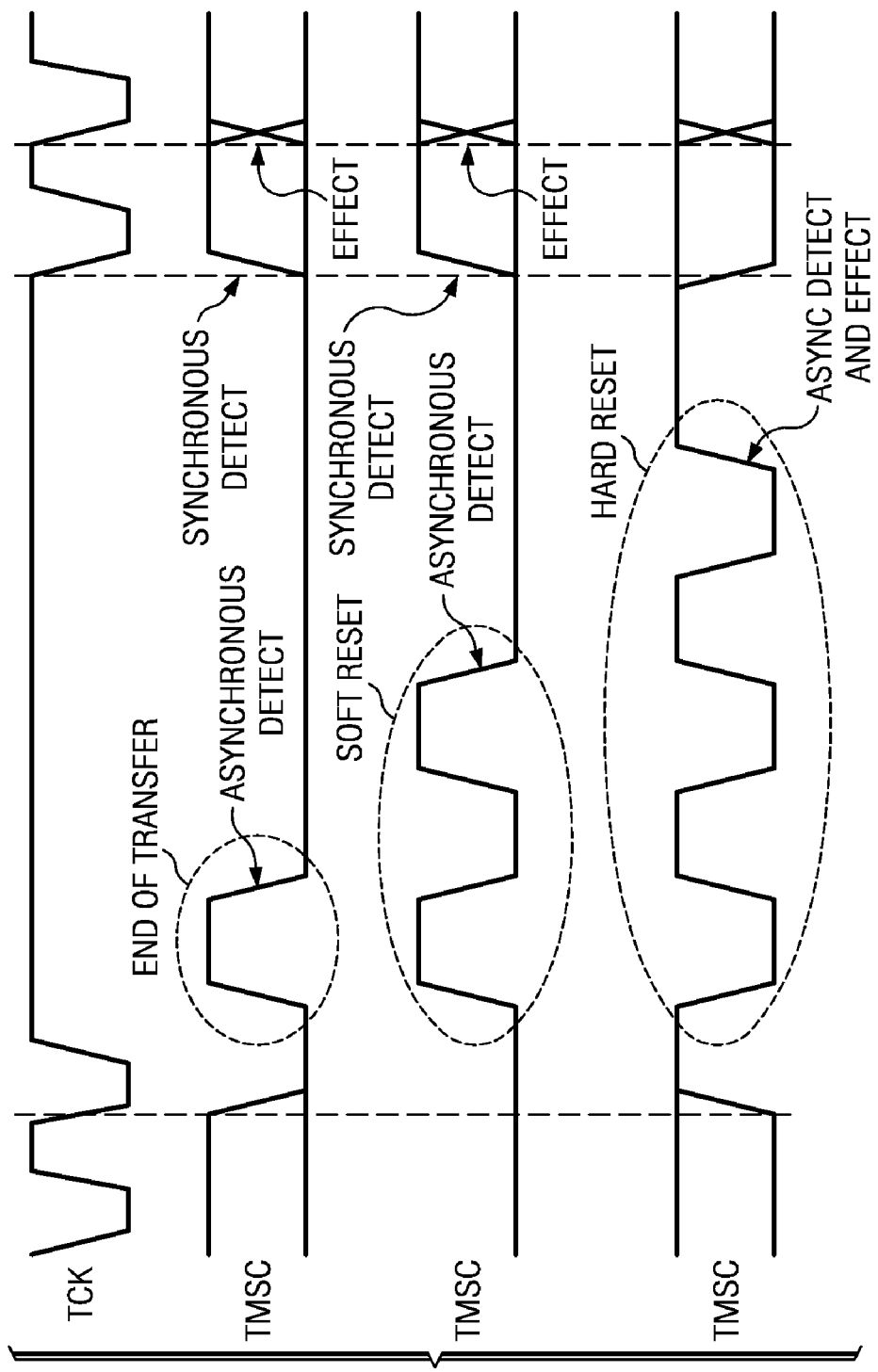
FIG. 17 illustrates the timing diagram for several escape sequences in accordance with at least some preferred embodiments.

FIG. 17 illustrates how the TCK and TMS signals are used to create an end-of-transfer escape sequence that is detectable by a cJTAG adapter but has no effect on a JTAG TAP state machine. In the preferred embodiment of FIG. 17, serialized data is transferred between the debug test system and the target system using the TMS signal and clocked between the systems using the TCK signal. At the end of an OScan that omits the TMS bit within the packet transferred, the TCK signal is held high by the DTS cJTAG adapter, which keeps any TPA state machine that is coupled to the TMS and TCK signals from transitioning states. The TMS signal is then subsequently set to the inverse of its last state by the DTS cJTAG adapter, and then pulsed while the TCK signal continues to be held high. A TS cJTAG adapter coupled to the TMS and TCK signals counts the pulses. After the pulsing completes, the TMS signal is returned to its initial value at the start of the escape sequence and the clock is restarted. One clock cycle later, the escape sequence takes effect. Although the escape sequence of the preferred embodiment described uses the TMS signal for transferring data, any other non-TCK signal may be used, and the present disclosure is intended to encompass all such embodiments.

As illustrated in FIG. 17, the escape sequences of the preferred embodiments can be used for purposes other than just an end-of-transfer indication. Both a soft reset and a hard reset are shown. Each uses a different number of pulses to indicate which function is desired. Further, the hard reset sequence does not require that the clock resume, allowing a full reset of the cJTAG link even after a failure of the clock to resume. Many other functions can be added by adding additional pulse counts, and the present disclosure is intended to encompass all such functions. Within at least some of the preferred embodiments, any additional functions would be implemented with a lower pulse count than soft and hard reset. In this way hard reset always requires the highest pulse count and would be triggered without having to restart the clock and also would be triggered if the TMS signal gets stuck in a continuous toggle.

As described above, both soft and hard reset escape sequences are implemented in at least some of the preferred embodiments. A soft reset escape sequence is used to place an offline cJTAG adapter back online. The soft reset escape sequence is ignored unless the cJTAG adapter is operating in advanced mode and is in a state that allows a soft reset. A soft reset escape sequence is allowed immediately after a register write while in advanced mode, and anytime if the cJTAG adapter has been placed offline by enabling an unsupported feature. The soft reset places the cJTAG adapter into IEEE mode, deselects the cJTAG adapter, and closes any open command windows, but does all this without re-initializing any other part of the cJTAG adapter. A hard reset escape sequence provides the same functionality as a JTAG test reset or a JTAG boundary compliance enable. A hard reset asynchronously changes the system state in either IEEE mode or advanced mode. A hard reset may be generated independent of the cJTAG adapter state. A hard reset is never ignored.

As illustrated in FIG. 12, different OScans are used depending on the source of the clock signal used for the cJTAG link. OScans 0-3, for example, are not allowed if the target system sources the clock. This is due to the fact that the data packets for these OScans do not include the TMS bit, and thus require the use of an end of transfer escape sequence. In order for the debug test system to signal the end of transfer, the debug test system must control the clock. In at least some of the preferred embodiments the DTS cJTAG adapter can check a register within the cJTAG adapter to determine the currently configured clock source. If an OScan is requested that requires that the debug test system source the clock, but the target system is configured to source the clock, a compatible OScan will be used instead (i.e., one of OScans 4-7), regardless of the OScan that is requested.

Another extension to the JTAG architecture added by the cJTAG architecture of at least some of the preferred embodiments is the ability to select and de-select cJTAG systems without affecting JTAG target systems that are also present in the system. A JTAG target system is de-selected when it is in bypass mode, i.e., when it has executed a bypass instruction and all data is being routed through the 1-bit bypass register of the target system. A cJTAG target system is de-selected when it is in global bypass mode and the cJTAG adapter halts the clock provided to the target system TAP. The cJTAG global bypass mode is similar to the JTAG bypass mode in that it also executes a corresponding global bypass instruction (in advanced mode) that results in all data being routed through the 1-bit global bypass register, as show in FIG. 18. But unlike the JTAG bypass mode, global bypass mode also results in all instructions being routed through the 1-bit global bypass register.

Selection of a JTAG target system is accomplished by taking the JTAG target system out of bypass mode. Selection of a cJTAG target system is a two-step process that includes a pre-selection of the desired cJTAG target systems, followed by activation of the pre-selections 1 clock cycle after entry by the target system TAP into the run-test/idle state (see FIG. 6A). As previously noted, de-selection of a target system blocks the clock signal to the target system TAP. The TAP, which is left in the run-test/idle state after de-selection, does not sequence any further after de-selection because it is no longer receiving a clock signal. By splitting the selection into a pre-selection that blocks the clock, followed by activation of the pre-selections which re-enable the clock, multiple target systems may be pre-selected in sequence, followed by a single activation that triggers all the pre-selects together. The pre-selects will all go into effect 1 clock cycle after the activation. The effect is to create a global selection of multiple target systems coupled to a single port of the test data system.

Global selection of multiple target system can be expanded to operate across multiple ports. In at least some preferred embodiments, the debug test system may have multiple cJTAG ports that each couple to multiple target systems. In such preferred embodiments, the ports may be enabled and disabled through a single control register within the debug test system. After the target systems of a port are de-selected, the port itself is disabled. Each port is then enabled in sequence, and while enabled the above described pre-select sequences are performed on one or more target systems. After pre-selects of the desired target systems have been performed on one port, but before activation, the port is disabled as a second port is enabled. The pre-selection process is then repeated for target systems coupled to the second port, and then again for each successive port. Once all ports have been processed and all the desired target systems on all ports are pre-selected, the ports are all enabled together and all of the target systems are activated at once. The effect is to create a global selection of multiple target systems coupled to multiple ports of the debug test system.

In at least some of the preferred embodiments, as previously noted, a debug test system may be coupled to one or more target systems in either a serial or star configuration. In the series configuration shown in FIG. 2B, both JTAG and cJTAG target systems may be present. The commands used to select a cJTAG target system (pre-selection and activation) are advanced mode commands and are ignored by JTAG target systems as no-ops. In the star configurations shown in FIG. 2B, by contrast, all of the target systems must be cJTAG target systems.

Figure 19:
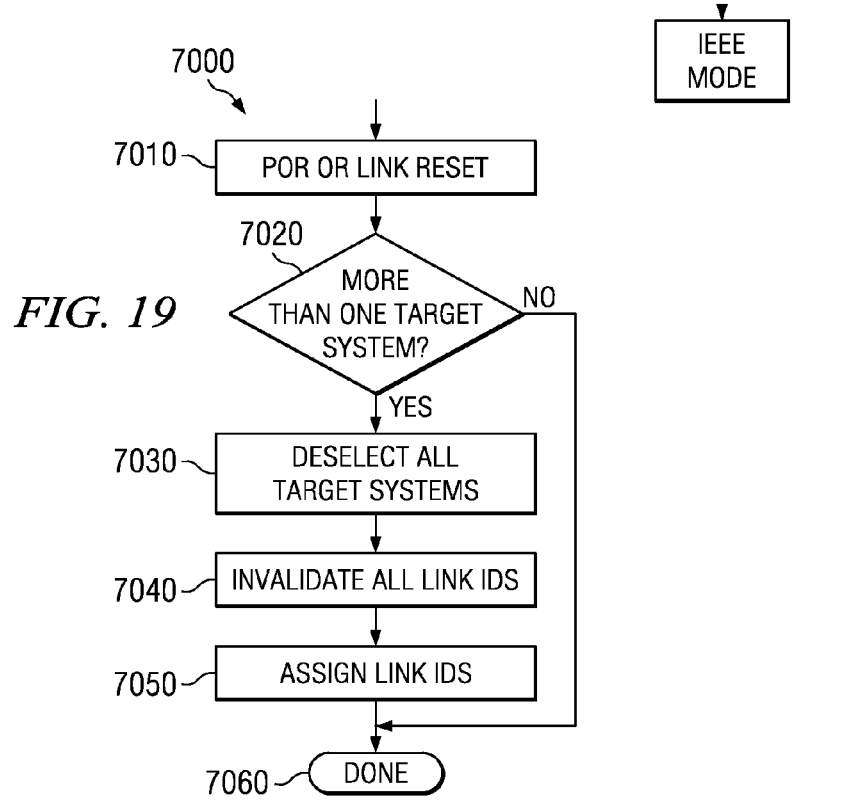
FIG. 19 illustrates a method for assigning link IDs within a cJTAG enabled system in accordance with at least some preferred embodiments.

In order to address cJTAG target systems in a star configuration, each cJTAG target system must have a unique adapter ID that allows it to be accessed exclusively at a given point in time. To accomplish this, at least some of the preferred embodiments utilize a 4-bit link identifier which is dynamically assigned by the debug test system to each target system. FIG. 19 illustrates how an ID is assigned to each cJTAG target system. The assignment method 7000 begins with either a power-on reset or a reset of the link coupling the debug test system and target systems to each other (see Wide Star configuration, FIG. 2B), as shown in block 7010. In this state each target system defaults to a link ID of 0, blocks link ID assignment by setting its individual scan status to zero, forces the use of Multi-device Scans ("MScans"), and becomes de-selected. If there is only one target system coupled to the debug test system (block 7020), no ID assignment is necessary and the ID assignment method 7000 is done (block 7060). Operation may begin by selecting the target system with ID zero, and by using MScans (described below) to access the target system.

If there is more than one target system (block 7020) then all of the target systems are de-selected (block 7020) and the link IDs of all of the target systems are invalidated by setting the scan status of each target system to one (block 7030). In at least some of the preferred embodiments the de-selection and invalidation blocks are implemented with advanced mode command sequences that use commands such as those listed in FIG. 8B. Referring again to FIG. 19A, once de-selection and invalidation are complete, ID assignment can proceed (block 7050), completing the method 7000 (block 7060).

Figure 20:
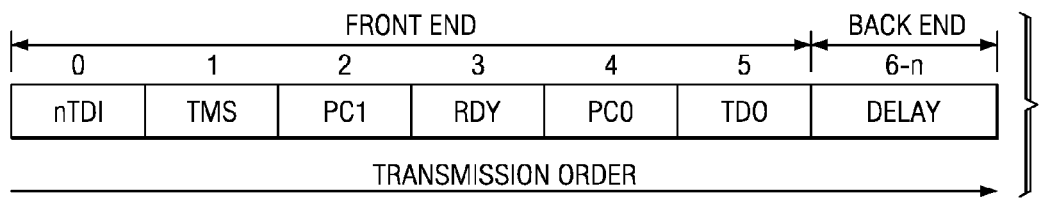
FIG. 20 illustrates an example of a multi-device scan message format in accordance with at least some preferred embodiments.

As already noted the target systems initially are forced to use MScans. FIG. 20 illustrates the basic data format for an MScan message. Though very similar to the previously described OScan7 message format, the MScan has two additional bits, pre-charge bits 0 and 1 ("PC0" and "PC1"). The ready and TDO bits of at least some of the preferred embodiments are driven by the target systems. But in the star configuration, with multiple target systems coupled to a single debug test system, it is possible for multiple target systems to sometimes attempt to output the ready ("RDY") or TDO bits at the same time, creating a signal conflict on the TMS signal line. To prevent this conflict, the target systems drive the TMS signal line with the ready and TDO bit information using a pre-charge/discharge signal drive configuration, together with bus-keeper latches, when using MScans.

Figure 21:
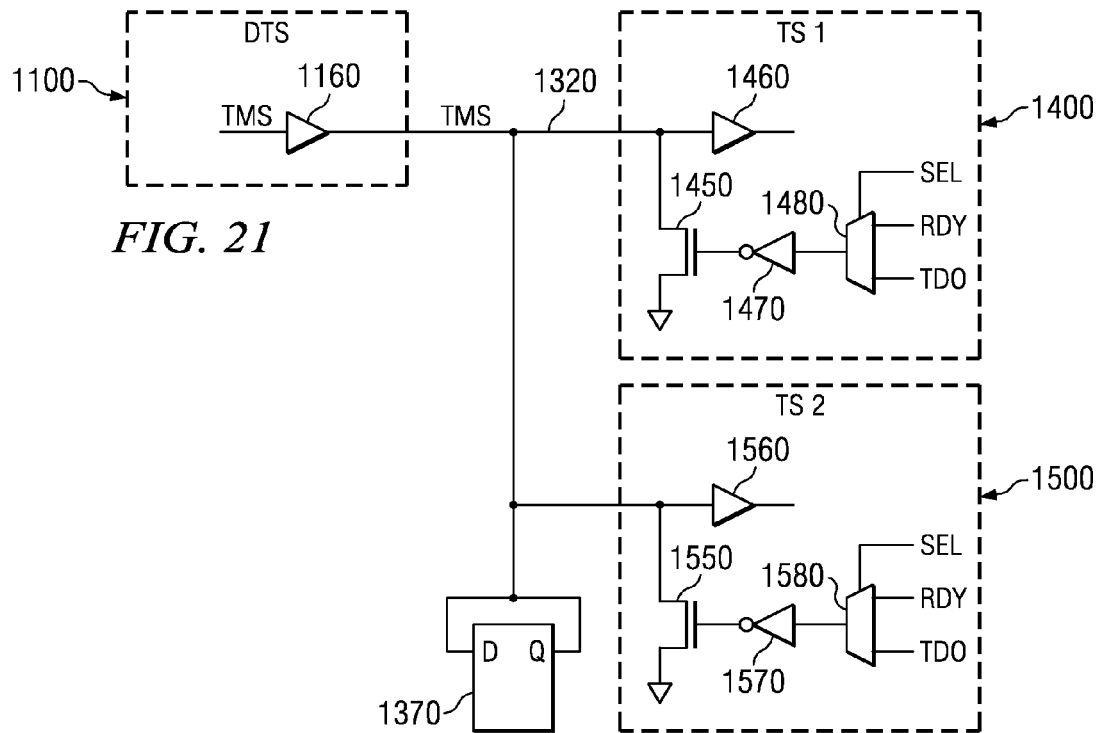
FIG. 21 illustrates a circuit used to allow target system isolation for later link ID assignment in accordance with at least some preferred embodiments.

FIG. 21 illustrates the hardware configuration used to prevent bus conflicts on the TMS signal line 1320 together with the MScan format. Referring to both FIGS. 20 and 21, the pre-charge one ("PC1") bit, which is always a binary one, is output by the DTS TMS driver 1160 and loaded into keeper latch 1370. A keeper latch is a latch with an output driver that is significantly weaker than other output drivers coupled to the same signal as the input and output of the keeper latch 1370. When DTS TMS driver 1160 outputs a signal, it will overcome the drive of the keeper latch 1370, if they are driving opposite states, and keeper latch 1370 will change state accordingly. In the absence of any drive on the TMS signal line 1320 output driver 1160, keeper latch 1370 will maintain or "keep" the latched bit driven on the signal line. During the TDO bit cycle time, if either target system 1 ("TS1") or target system 2 ("TS2") outputs a TDO value of zero, the corresponding pull-down gate (1450 or 1550) will drive the TMS signal line 1320 low, causing keeper latch 1370 to also change to a zero. If neither target system drives TMS signal 1320 to a zero, it will remain in the kept state, which is the logical one driven onto TMS signal 1320 during the PC 1 bit cycle. This same mechanism is also used with the ready bit, in combination with the pre-charge zero ("PC0") bit.

Figure 23:
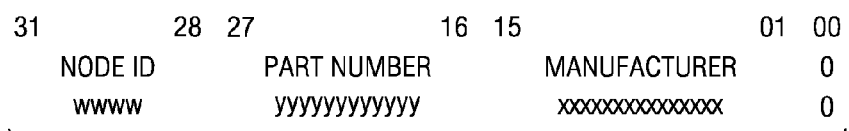
FIG. 23 illustrates an example of a format for a unique cJTAG isolation pattern in accordance with at least some preferred embodiments.
Figure 22A:
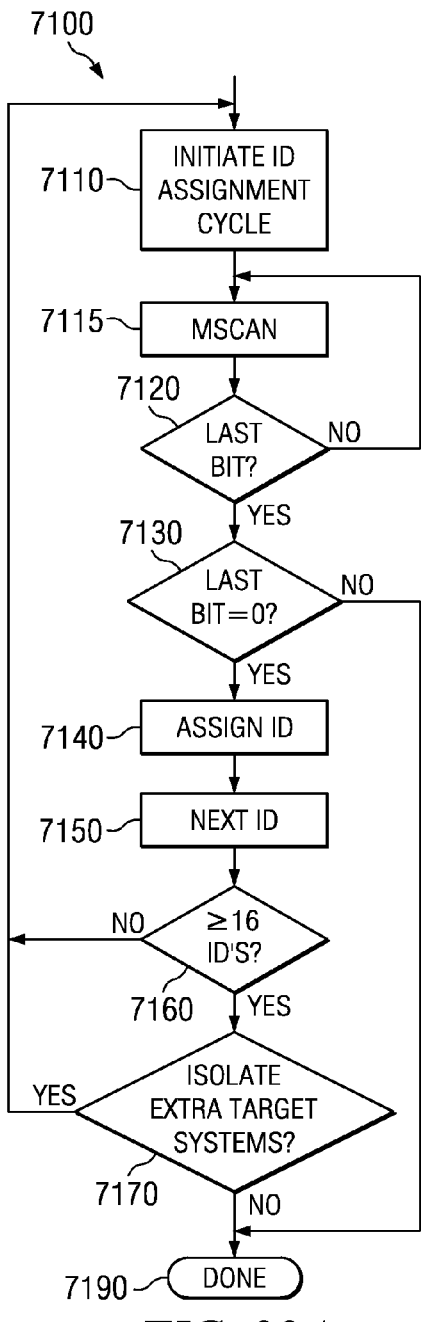
FIG. 22A illustrates a method implemented in a debug test system for assigning link IDs in accordance with at least some preferred embodiments.

By taking advantage of the "wire-OR" configuration of TMS signal 1320 and the MScan format, individual target systems may be isolated and subsequently assigned a unique link ID. FIG. 22A illustrates a debug test system ID assignment method 7100, in accordance with at least some preferred embodiments. After sending an advanced mode command sequence to all coupled target systems to initiate an assignment cycle (block 7110), the debug test system begins initiating a series of MScans (block 7115) in which one or more of the target systems output bits from a unique isolation pattern. An isolation pattern is a unique identification number associated with each target system. FIG. 23 illustrates an example of an isolation pattern, in accordance with at least some preferred embodiments, comprising a node ID, a part number, an manufacturer's ID, and a zero for the last bit. The part number combined with the manufacturer's ID and the last bit (set to zero) is a 28-bit identifier that is sometimes referred to as the JTAG ID. The 4-bit node ID provides a means for identifying a target system when two target systems have the same JTAG ID. Other techniques for generating unique isolation patterns for each target system will become apparent to those skilled in the art, and the present disclosure is intended to encompass all such techniques.

The debug test system waits for the MScan comprising the last isolation pattern bit to complete (block 7120) and then checks to see if the last bit is a zero (block 7130). If it is not a zero then the pre-charge has not been pulled down by any of the target systems, all have been assigned a link ID, and the assignment method 7100 has completed (block 7190). If the last bit is a zero then a target system has pulled down the pre-charge of the last bit, has been isolated, and the debug test systems assigns a link ID to the isolated target system (block 7140). The debug test system than increments the link ID (block 7150) and checks to see if the link ID equals or exceeds 16 (block 7160). If so, more than 16 link IDs have been assigned. The debug test system then checks to see if it is configured to continue to isolate the additional target systems coupled to the debug test system (block 7170). If more than 16 target systems are coupled to the debug test system, it may become necessary for at least some of the target systems to share link IDs. If the debug test system is configured to share IDs, the extra target systems may optionally be isolated as well so that additional processing may be performed later to share link IDs between two or more target systems (described below).

Figure 22B:
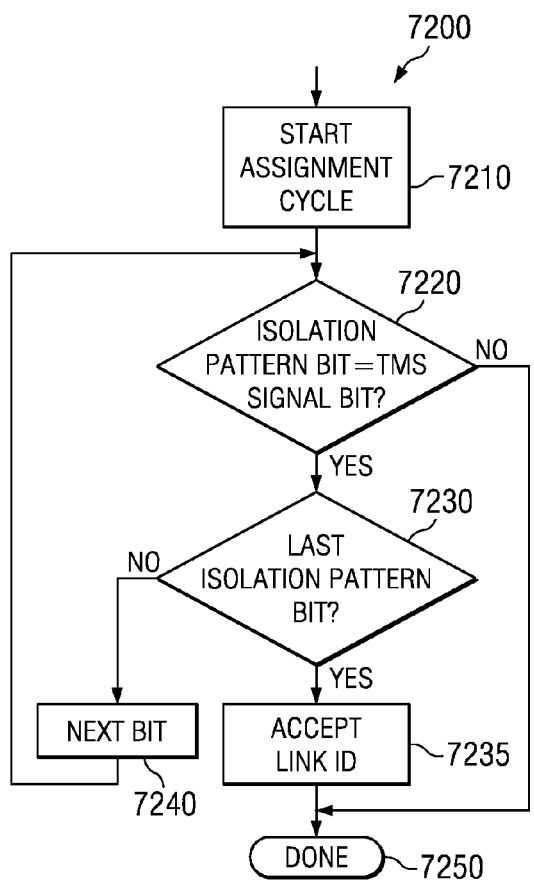
FIG. 22B illustrates a method implemented in a target system for assigning link IDs in accordance with at least some preferred embodiments.

FIG. 22B illustrates a target system ID assignment method 7200 corresponding to the debug test system assignment method 7100, and in accordance with at least some preferred embodiments. After an assignment cycle has been started (block 7210) and MScans are being generated, the target system begins outputting each bit of its assigned isolation pattern during the TDO bit period of each MScan. If the target system detects a discrepancy between the TDO bit value output by the target system and the binary value present on the TMS signal line (block 7120), the target system will exit (block 7250) and cease participating in the current ID assignment cycle. If the binary value present on the TMS signal line matches the TDO bit value output by the target system, the target system checks to see if the current bit is the last bit of the isolation pattern (block 7230). If the current bit is the last bit, then the target system has been isolated and is assigned a link ID (block 7135), and the current assignment cycle ends (block 7250). Otherwise the next bit is output (block 7240) and the process is repeated.

As already noted, it is possible to have more target systems coupled to the debug test system in a star configuration than can be accommodated directly by the bit-width of the assigned link IDs. In this situation at least some of the preferred embodiments allow for sharing of link IDs. Sharing is accomplished by determining the number of target systems coupled to the debug test system, and selectively de-selecting some target systems while expressly assigning link IDs to the remaining target systems, such that the total number of assigned link IDs never exceeds the maximum number of available link IDs. To accomplish such an express ID assignment, a command level is defined for at least some of the preferred embodiments wherein the target systems are blocked from outputting the TDO bit (e.g., command levels 3, FIG. 8A). During an assignment cycle, the debug test system acts as a surrogate for the target system expressly being assigned a link ID, and outputs the isolation pattern of behalf of the target system. By outputting the target system's isolation pattern, the desired target system will be the system remaining at the end of the ID assignment cycle, expressly forcing the assignment of the link ID to the desired target system.

As already noted once all the available IDs have been assigned, the debug test system can detect that there are still additional target systems requiring a link ID. By going through additional assignment cycles, the debug test system can count the number of target systems in excess of the available link IDs. Further, the isolation patterns for the "extra" adapters may be saved for future use in resolving the link ID shortage (e.g., by using the sharing scheme described above). In at least some of the preferred embodiments, a single link ID is used and all of the adapters share that common ID.

The cJTAG adapters of at least some preferred embodiments are also capable of supporting non-scan data transfers between the debug test system and one or more target systems. These transfer background data transfers (BDX) take advantage of the time that the target system TAPs spend in one of several BDX-supporting states such as, for example, the run-test/idle, pause_DR, and pause_IR states (see FIG. 4). The transfer substitutes BDX information in lieu of the scan packet normally associated with a target system TAP state. A background data transfer may be initiated by a cJTAG control register write performed after the target system TAP has been in the BDX-supporting state for at least two consecutive scan packet cycles. Once a background data transfer has been activated the target system TAP state is advanced by each background data transfer. The selected target system transfers data while target systems not selected transition through the same states as the target system transferring data, but without actually participating in the transfer. This keeps the TAP states of the target systems synchronized. The background data transfer is terminated upon exit from the supporting state. Data may be transferred exclusively in one direction (to the target system, or to the debug test system), or alternately in both directions (bidirectional transfer). The bandwidth allocation of a bidirectional transfer in at least some of the preferred embodiments is 50/50, but other allocations are possible and all such allocations are intended to be within the scope of the present disclosure.

Figure 24:
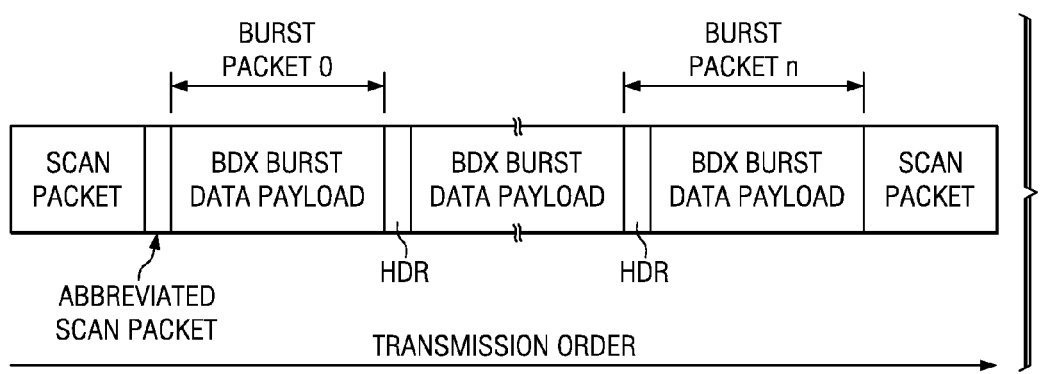
FIG. 24 illustrates an example of a burst background data transfer message format in accordance with at least some preferred embodiments.
Figure 25:
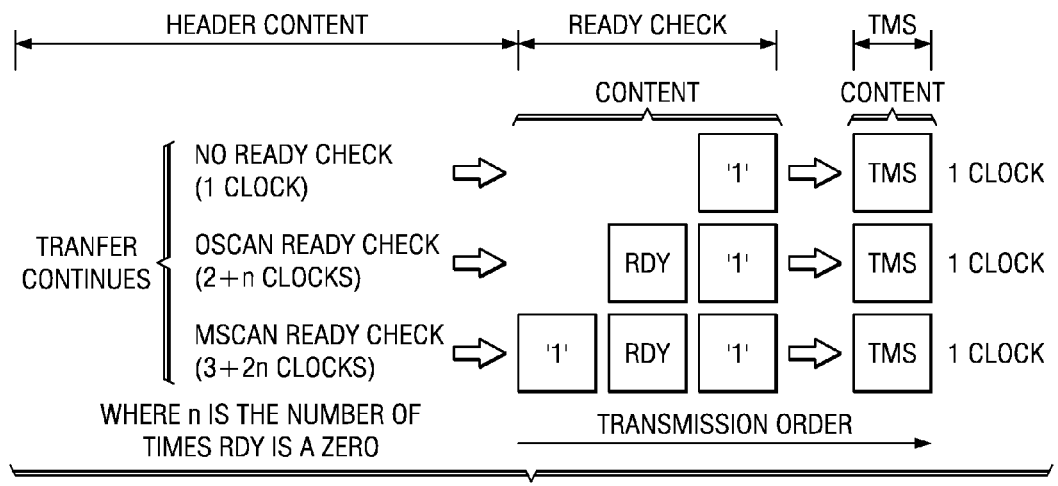
FIG. 25 illustrates an example of a burst background data transfer message header in accordance with at least some preferred embodiments.

Two types of background data transfers, burst and continuous, are defined for at least some of the preferred embodiments. FIG. 24 illustrates the format of a burst background data transfer. As shown, the first burst packet of a newly activated transfer skips the header and begins with an abbreviated scan packet followed by burst data packets. Subsequent packets include the header, which is formatted depending on the scan format in effect prior to activating the background data transfer. FIG. 25 illustrates several different header configurations, in accordance with at least some preferred embodiments, as well as the association between the header configurations and the cJTAG scan formats. When scan formats that support the use of scan stalls or delays are in use, the background data transfer will also support such stalls and delays using the same mechanisms as those defined for the scan format. Although the burst data packets of the preferred embodiments are of fixed bit sizes (e.g., 8, 16, 32, or 64 bits), other bit widths may be used and the present disclosure is intended to encompass burst packet sizes of all such bit widths.

It should be noted that the TMS bit of the burst background data transfer header is driven by the debug test system, while the bits associated with the ready check, are driven by the target system participating in the transfer. This is done in order to protect against a disconnect of the TMS signal between the debug test system and the target systems. Referring to FIG. 21, if such a disconnect occurs, the logic "1" driven by the active target system at the end of the ready check sequence of the BDX header will be maintained by keeper latch 1370. As a result, when the debug test system fails to drive the TMS bit to a logic "0," TMS will be seen as a logical "1," the target system TAP state machines of all the target systems will exit the BDX-supporting state, and the background data transfer will end. Further, because a logical "1" continues to be present on the TMS signal 1320, the target system TAP state machine of all the target systems will eventually sequence back to the test-reset/idle state (see FIG. 4). This will only happen, however, if the target system is sourcing the clock, or if the debug test system is sourcing the clock and has not also been disconnected from the target systems.

Figure 26:
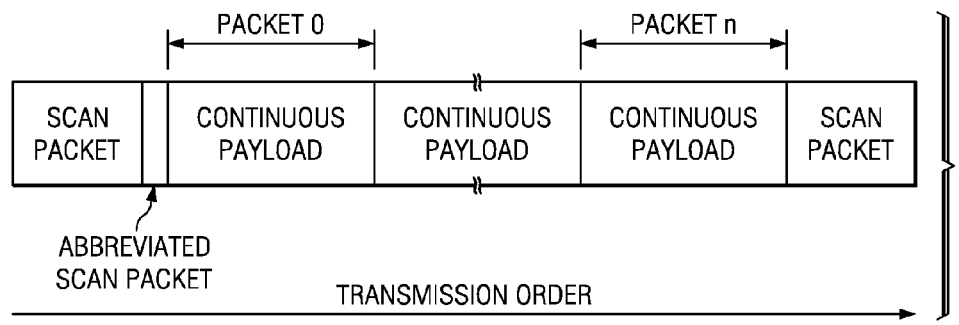
FIG. 26 illustrates an example of a continuous background data transfer message format in accordance with at least some preferred embodiments.
Figure 27:
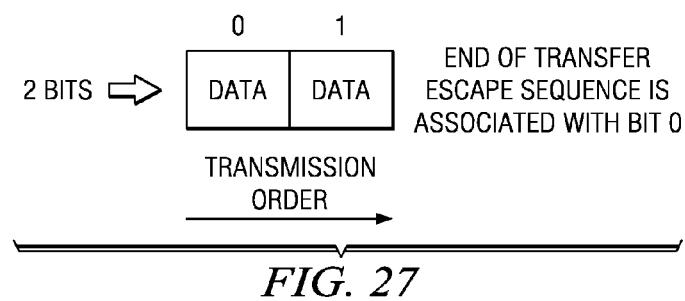
FIG. 27 illustrates an example of a continuous background data transfer message payload format in accordance with at least some preferred embodiments.

FIG. 26 illustrates the format of a continuous background data transfer. Unlike burst background data transfers, continuous background data transfers do not have any header information, and the data is simply a two-bit payload, although it is intended that the present disclosure encompass any size payload for continuous background data transfers. Continuous background data transfers are ended using the end of transfer escape sequence previously described. Because continuous background data transfers do not use headers, stalls and delays are not supported during these transfers. As a result, at least some of the preferred embodiments will force a selected continuous background data transfer to be executed as a burst background data transfer if the format in effect upon activation of the background data transfer requires scan stalls. Burst background data transfers will also be forced if the target system is the source of the clock, and also if the scan packets are configured with delays between packets.

Figure 28:
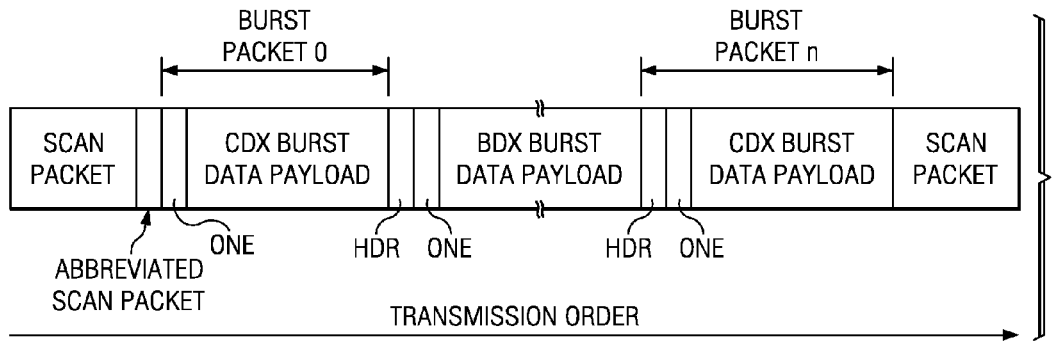
FIG. 28 illustrates an example of a burst custom data transfer message format in accordance with at least some preferred embodiments.
Figure 29:
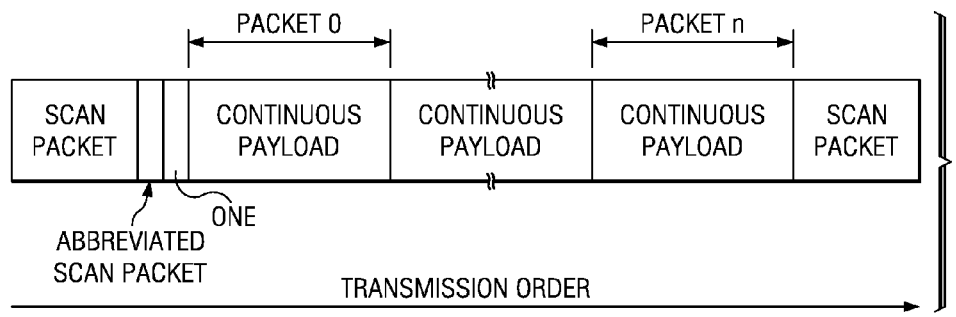
FIG. 29 illustrates an example of a continuous custom data transfer message format in accordance with at least some preferred embodiments.

The cJTAG adapters of at least some preferred embodiments are also capable of supporting non-scan data transfers between the debug test system and one or more target systems using non-cJTAG hardware and protocols incorporated into the cJTAG adapters. As shown in FIGS. 28 and 29, these custom data transfers (CDX) are similar to background data transfers, differing only by the inclusion of an extra bit preceding each of the burst payload packets and the first continuous payload packet. This extra bit is always a one and accounts for the case where the CDX hardware of neither the debug test system nor of any target system starts to transfer data after activation of the continuous data transfer. The system recovers in a manner similar to the TMS signal disconnect case described above for background data transfers. In all other respects continuous data transfers operate in the same manner as background data transfers.

Figure 30:
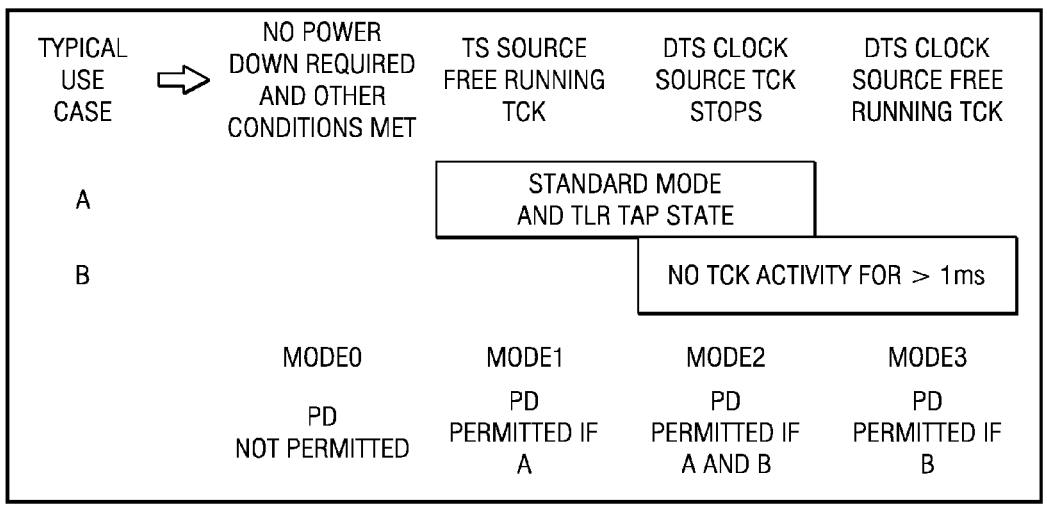
FIG. 30 illustrates an example of power down modes.

The cJTAG architecture has the added capability of configuring parts of the cJTAG interface of the target system to be powered-down under selected conditions. FIG. 30 illustrates some of the conditions under which such a power-down is allowed by at least some of the preferred embodiments. Four power-down modes are defined and the power-down mode is selected at power-on reset. The four modes include not permitting a power-down when requested (mode 0), permitting a power-down when requested if the state machine of the target system cJTAG TAP is in the test logic reset ("TLR") state (mode 1), permitting a power-down if the state machine of the target system cJTAG TAP is in the test logic reset state and there has been no link clock (TCK) activity for more than 1 millisecond (mode 2), and permitting a power-down based only on the lack of a link clock for more than 1 millisecond (mode 3). Although the preferred embodiment shown in FIG. 30 uses a 1 millisecond inactivity period, other inactivity periods are possible and are intended to be within the scope of the present disclosure.

Figure 31:
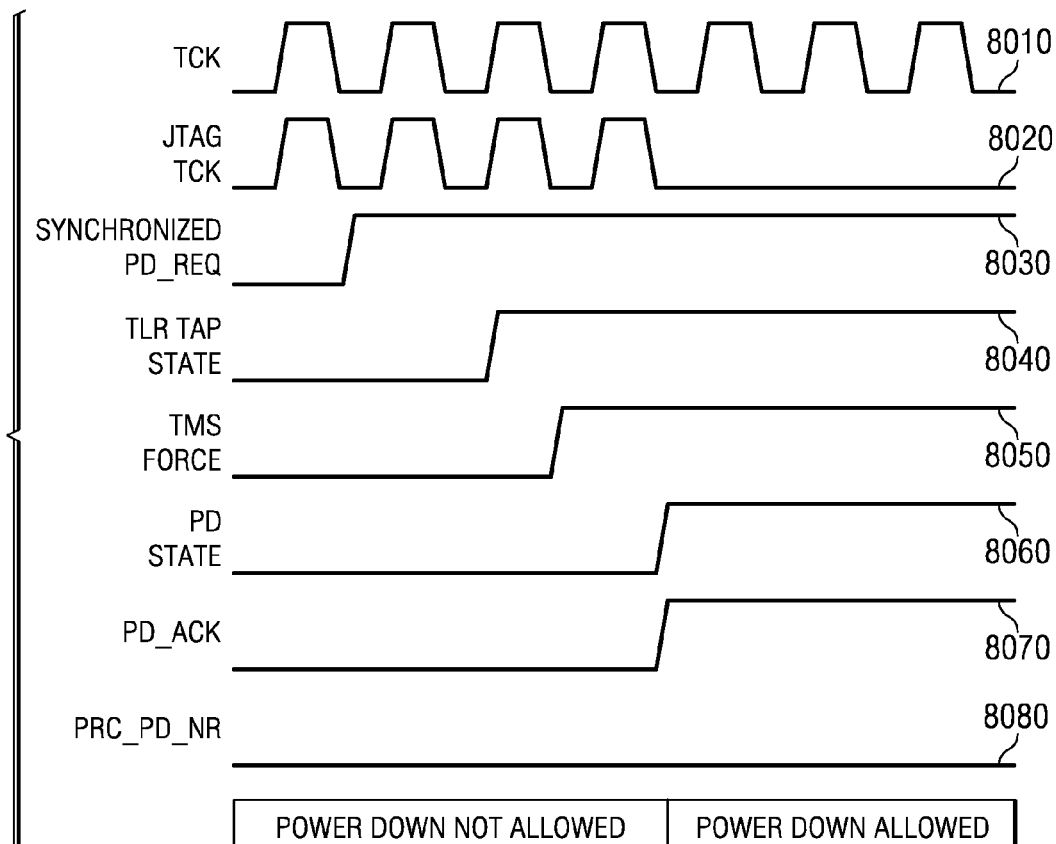
FIG. 31 is a timing diagram illustrating an affirmative response power down.

Mode 0 and mode 1 operate in an "affirmative response" ("AR") model. Both modes involve a requested operation while the link clock is up and running. The request originates from logic external to the TS cJTAG adapter and is referred to as the Power and Reset Controller ("PRC"). As shown in FIG. 31, the PRC asserts synchronized power-down request 8030 when the PRC is in mode 0 or mode 1. After the TS TAP indicates that it has entered into the test logic reset state (TLR TAP state signal 8040 asserted), and indicates that TMS has been asserted (TMS force 8050), the TS cJTAG adapter performs an orderly shutdown of the cJTAG interface (indicated by PD state 8060), halts the JTAG clock 8020, and acknowledges the power-down request (PD_ACK 8070).

Figure 32:
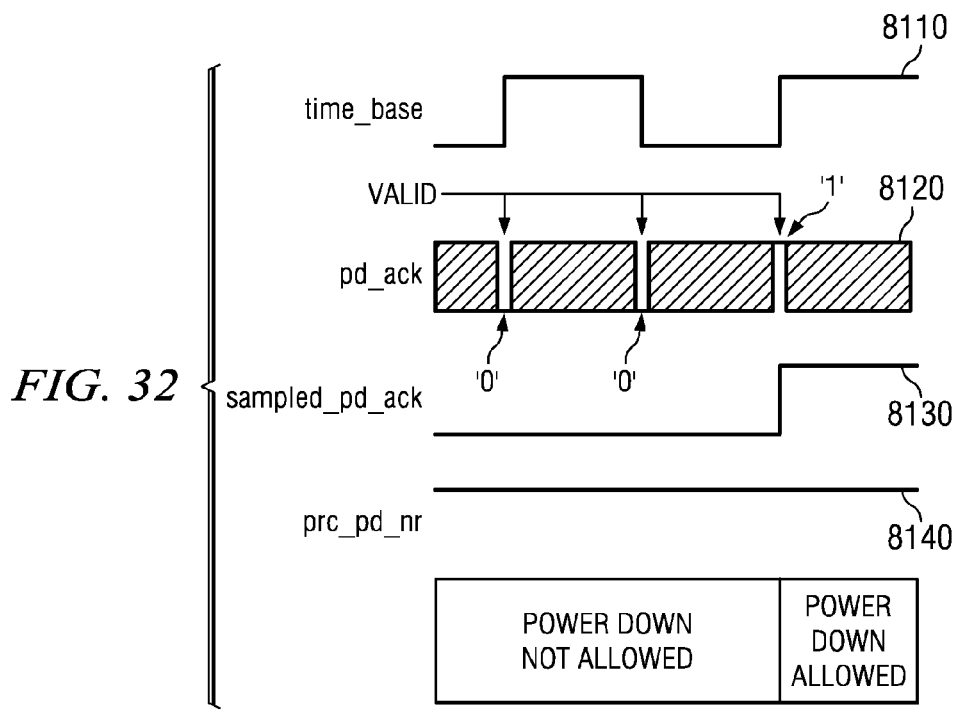
FIG. 32 illustrates an example of non-response power down.

Mode 2 and mode 3 operate in a "non-response" ("NR") model. As shown in FIG. 32, in these modes of operation the PRC generates an event that may generate a power-down acknowledge. If a power-down acknowledge is generated, the TS cJTAG adapter must negate the power-down acknowledge within the inactivity period. In the preferred embodiment of FIG. 32, the TS cJTAG adapter periodically toggles the power-down acknowledge 8120 at an interval that is half the duration of the time base 8110. The time base has a period that is equal to the inactivity period. Periodically toggling the power-down acknowledge 8120 acts as a "keep alive" heartbeat that prevents the PRC from powering down the TS cJTAG adapter. If the acknowledge does not negate the state of the power-down acknowledge within the inactivity period, the sampled power-down acknowledge 8130 will remain at the same state for a period of time exceeding the inactivity timeout, and the power down will be allowed.

It is possible that system operation may be changed or corrupted by a make or break in the connection of a debug test system and target system. In accordance with embodiments of the invention, a "firewall" is implemented to reduce the chance that system operation is changed or corrupted by a make or break in the connection of a debug test system and target system in a mix of powered and un-powered configurations.

A firewall between the debug test system and target system interfaces may be created at power-on resest (POR) or under the direction of the debug test system. The firewall blocks the TCK signal to the target system TAPs attached to the cJTAG interface which prevents the TAP from advancing. The firewall may be raised and lowered within a command window. Command windows were explained previously.

The firewall may easily be removed by standard scan sequences after POR without knowing the system state or scan topography. Commands within a command window change register values controlling the firewall. Changes in the state of the firewall take effect when the system TAP state reaches the IDLE state.

Devices with an enabled firewall are entirely compatible with those that do not have an enabled firewall as the firewall merely enables the global bypass provided by the Global Bypass bit in addition to disabling the advance of the system TAPs connected to the cJTAG interface.

The firewall may be removed prior to performing any other action such as obtaining the device ID with the IDCODE instruction created by the TLR TAP state. The sequence used to disable the firewall is treated as a no-operation by standard JTAG devices or cJTAG devices whose POR interface disables the firewall. This makes both fire walled and non-firewalled operation entirely compatible with systems using JTAG protocols.

A debug and test interface where a firelink characteristic is controlled by registers managed by the link. The registers may be on either the host or target side of the link.

It is possible that the electrical connection between the DTS and the TS breaks (e.g., cable disconnected). Embodiments of the invention provide for orderly behavior in such situations. The response may depend on whether the TS or the DTS is supplying the TCK signal. If, for example, the TS is supplying TCK, the TS's TAP transitions to the TLR state and the adapter then powers down. In the preferred embodiments, the negative of the TDI (nTDI) signal is used. The nTDI assures TDO value of "1" in shift state generates a TMS of "1". The control states generate TDO value of "1" in non-shift state which also produces a TMS of "1". The state of the TAP transitions to the test logic reset (TLR) state. When at the TLR state, the adapter detects two TMS of "1" which then causes a hard reset. At this point, the adapter is back in the IEEE mode with the TAP state at TLR. The hard reset initializes power down mode to default POR value and permits power down if the mode so permits.

In the case in which the DTS is supplying TCK, the preferred behavior is freeze the adapter state and if power down mode with no TCK is used, the PRC asserts POR after no TCK time limit is exceeded. An absence of TCK precludes any advancement of the adapter state. The BCE pin, which has a pull down connection, goes low which resets all test logic.

In some embodiments, the DTS may desire to determine the cJTAG topology (e.g., star, series). After POR and physical connection to the TS, the DTS automatically determines the port type. The DTS stimulates the interface first as an IEEE Star interface. If the DTS finds such an interface, the DTS may determine if it is a CTAP Star interface. If the DTS does not find a Star interface configuration, the DTS stimulates the interface as an IEEE series interface. If the DTS finds this interface type, the DTS may determine whether the interface has only CTAP enabled devices, a mix of CTAP and Legacy devices, or has only Legacy devices. If neither of these interface types is found, the port is stimulated as a cJTAG link. After this stimulation, this interface is either found or the link is deemed dead.

The above disclosure is meant to be illustrative of the principles and various embodiments of the present invention. Numerous variations and modifications will become apparent to those skilled in the art. It is intended that the disclosure, including the claims, be interpreted to embrace all such variations and modifications.

What is claimed is:

1. A process of operating an integrated circuit comprising:
    A. placing target system test circuitry, which can operate in one of a test mode of passing test signals through the target system test circuitry and an advanced mode of preventing the passing of test signals through the target system test circuitry, and which target system test circuitry includes state machine circuitry, in the test mode of operation, in the test mode of operation the state machine circuitry can be stepped through at least states of Capture-DR, Shift-DR, and Update-DR;
    B. stepping the state machine circuitry, in the test mode, through a special sequence of the states that includes the Capture-DR state and Update-DR state and does not include the Shift-DR state;
    C. detecting the special sequence of the states in the target system test circuitry; and
    D. moving the target system test circuitry out of the test mode of operation and into the advanced mode of operation in response to the detecting.

2. The process of claim 1 in which the placing includes performing a power on reset of the integrated circuit.

3. The process of claim 1 including stepping the state machine circuitry through the states of Test Logic Reset, Run Test Idle, Select-DR Scan, Capture-DR, Shift-DR, Exit 1 DR, Pause DR, Exit 2 DR, and Update-DR in the test mode of operation.

* * * * *